(12) United States Patent
Kato et al.

(10) Patent No.: US 12,266,719 B2
(45) Date of Patent: Apr. 1, 2025

(54) SEMICONDUCTOR DEVICE, MANUFACTURING METHOD OF SEMICONDUCTOR DEVICE, AND POWER CONVERSION DEVICE COMPRISING SEMICONDUCTOR DEVICE

(71) Applicant: FUJI ELECTRIC CO., LTD., Kanagawa (JP)

(72) Inventors: Yoshiharu Kato, Matsumoto (JP); Yosuke Sakurai, Azumino (JP); Seiji Noguchi, Matsumoto (JP); Takashi Yoshimura, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 502 days.

(21) Appl. No.: 17/679,039

(22) Filed: Feb. 23, 2022

(65) Prior Publication Data

US 2022/0181472 A1    Jun. 9, 2022

Related U.S. Application Data

(63) Continuation of application No. PCT/JP2021/008535, filed on Mar. 4, 2021.

(30) Foreign Application Priority Data

Mar. 4, 2020  (JP) .................. 2020-037266
Nov. 12, 2020 (JP) .................. 2020-189021

(51) Int. Cl.
*H01L 29/739* (2006.01)
*H01L 29/10* (2006.01)
*H01L 29/36* (2006.01)

(52) U.S. Cl.
CPC ...... *H01L 29/7397* (2013.01); *H01L 29/1095* (2013.01); *H01L 29/36* (2013.01)

(58) Field of Classification Search
CPC .. H01L 29/7397; H01L 29/1095; H01L 29/36
See application file for complete search history.

(56) References Cited

U.S. PATENT DOCUMENTS 6,309,920 B1    10/2001  Laska
6,482,681 B1    11/2002  Francis
(Continued)

FOREIGN PATENT DOCUMENTS

JP    2001501382 A    1/2001
JP    2008091853 A    4/2008
(Continued)

OTHER PUBLICATIONS

International Search Report and (ISA/237) Written Opinion of the International Search Authority for International Patent Application No. PCT/JP2021/008535, issued/mailed by the Japan Patent Office on Jun. 1, 2021.

*Primary Examiner* — Fernando L Toledo
*Assistant Examiner* — Neil R Prasad

(57) ABSTRACT

Provided is a semiconductor device comprising: a semiconductor substrate provided with a drift region; a buffer region arranged between the drift region and the lower surface, wherein a doping concentration distribution has three or more concentration peaks; and a collector region arranged between the buffer region and the lower surface, wherein the three or more concentration peaks in the buffer region include: a first concentration peak closest to the lower surface; a second concentration peak closest, next to the first concentration peak, to the lower surface, arranged 5 μm or more distant from the lower surface in the depth direction, and having a doping concentration lower than the first concentration peak, the doping concentration being less than $1.0 \times 10^{15}/cm^3$; and a high concentration peak arranged farther from the lower surface than the second concentration (Continued)

peak, and having a higher doping concentration than the second concentration peak.

19 Claims, 19 Drawing Sheets

(56) References Cited

U.S. PATENT DOCUMENTS

| | | | |
|---|---|---|---|
| 10,043,865 | B2 | 8/2018 | Nemoto |
| 10,229,972 | B2 | 3/2019 | Imagawa |
| 10,304,928 | B2 | 5/2019 | Tamura |
| 10,312,331 | B2 | 6/2019 | Wakimoto |
| 10,847,608 | B2 | 11/2020 | Nemoto |
| 11,049,941 | B2 | 6/2021 | Ohi |
| 2008/0001257 | A1* | 1/2008 | Schulze ............... H01L 29/861 257/E29.2 |
| 2009/0224284 | A1 | 9/2009 | Nemoto |
| 2012/0267681 | A1* | 10/2012 | Nemoto ............... H01L 29/1004 257/139 |
| 2013/0249058 | A1 | 9/2013 | Neidhart |
| 2015/0270132 | A1 | 9/2015 | Laven |
| 2016/0111528 | A1* | 4/2016 | Schulze ............... H01L 29/167 438/138 |
| 2016/0141399 | A1 | 5/2016 | Jelinek |
| 2019/0066977 | A1 | 2/2019 | Jelinek |

FOREIGN PATENT DOCUMENTS

| | | |
|---|---|---|
| JP | 2008227414 A | 9/2008 |
| JP | 2009188336 A | 8/2009 |
| JP | 2019106544 A | 6/2019 |
| WO | 2011052787 A1 | 5/2011 |
| WO | 2016051973 A1 | 4/2016 |
| WO | 2016204126 A1 | 12/2016 |
| WO | 2016204227 A1 | 12/2016 |
| WO | 2018074434 A1 | 4/2018 |

\* cited by examiner e-e

SEMICONDUCTOR DEVICE, MANUFACTURING METHOD OF SEMICONDUCTOR DEVICE, AND POWER CONVERSION DEVICE COMPRISING SEMICONDUCTOR DEVICE

The contents of the following Japanese and PCT patent applications are incorporated herein by reference:
 No. 2020-037266 filed in JP on Mar. 4, 2020
 No. 2020-189021 filed in JP on Nov. 12, 2020, and
 No. PCT/JP2021/008535 filed in WO on Mar. 4, 2021

BACKGROUND

1. Technical Field

The present invention relates to a semiconductor device, a manufacturing method of a semiconductor device, and a power conversion device comprising a semiconductor device.

2. Related Art

Conventionally, a configuration in which a "field stopper layer (FS layer)" is provided in an "IGBT (insulated gate bipolar transistor) device" is known, (for example, see Patent Document 1).
 [Patent Document 1]: WO2016/204126
 The summary clause does not necessarily describe all necessary features of the embodiments of the present invention. The present invention may also be a sub-combination of the features described above.

DESCRIPTION OF EXEMPLARY EMBODIMENTS

Figure 1:
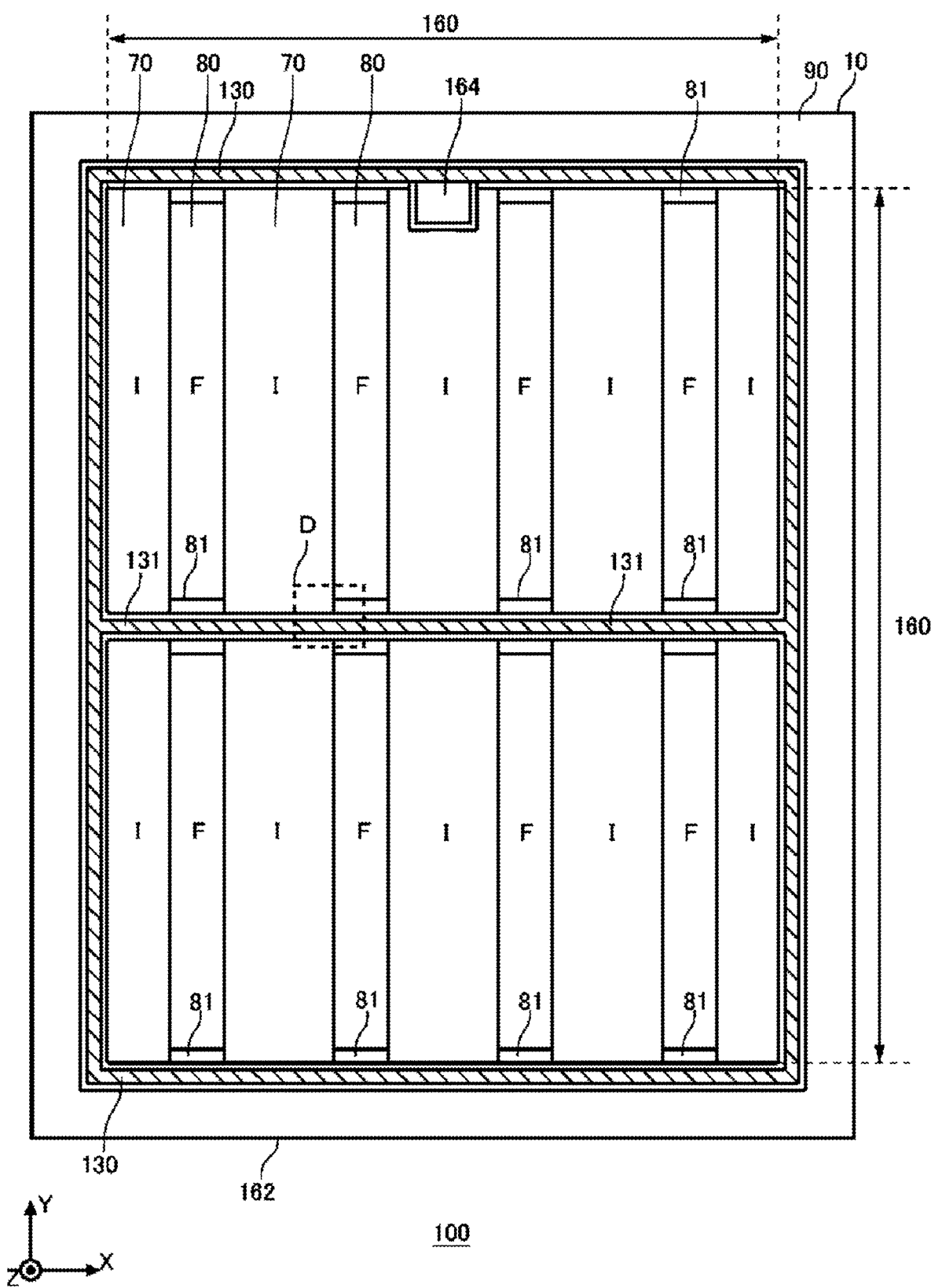
FIG. 1 is a top view showing an example of a semiconductor device 100.

Hereinafter, the invention will be described through embodiments of the invention, but the following embodiments do not limit the invention according to claims. In addition, not all of the combinations of features described in the embodiments are essential to the solving means of the invention.

In the present specification, one side in a direction parallel to a depth direction of a semiconductor substrate is referred to as "upper" and the other side is referred to as "lower". One surface of two principal surfaces of a substrate, a layer or other member is referred to as an upper surface, and the other surface is referred to as a lower surface. "Upper" and "lower" directions are not limited to a direction of gravity, or a direction in which a semiconductor device is mounted.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicating the height direction with respect to the ground. It is noted that a +Z axis direction and a −Z axis direction are directions opposite to each other. When the Z axis direction is described without describing the signs, it means that the direction is parallel to the +Z axis and the −Z axis.

In the present specification, orthogonal axes parallel to the upper surface and the lower surface of the semiconductor substrate are referred to as the X axis and the Y axis. Further, an axis perpendicular to the upper surface and the lower surface of the semiconductor substrate is referred to as the Z axis. In the present specification, the direction of the Z axis may be referred to as the depth direction. Further, in the present specification, a direction parallel to the upper surface and the lower surface of the semiconductor substrate may be referred to as a horizontal direction, including an X axis direction and a Y axis direction.

In addition, a region from the center of the semiconductor substrate in the depth direction to the upper surface of the semiconductor substrate may be referred to as an upper surface side. Similarly, a region from the center of the semiconductor substrate in the depth direction to the lower surface of the semiconductor substrate may be referred to as a lower surface side. In the present specification, the center position of the semiconductor substrate in the depth direction may be referred to as Zc.

In the present specification, a case where a term such as "same" or "equal" is mentioned may include a case where an error due to a variation in manufacturing or the like is included. The error is, for example, within 10%.

In the present specification, a conductivity type of doping region where doping has been carried out with an impurity is described as a P type or an N type. In the present specification, the impurity may particularly mean either a donor of the N type or an acceptor of the P type, and may be described as a dopant. In the present specification, doping means introducing a donor or an acceptor into a semiconductor substrate and turning it into a semiconductor presenting a conductivity type of the N type, or a semiconductor presenting conductivity type of the P type.

In the present specification, a doping concentration means a concentration of the donor or a concentration of the acceptor in a thermal equilibrium state. In the present specification, a net doping concentration means a net concentration obtained by adding the donor concentration set as a positive ion concentration to the acceptor concentration set as a negative ion concentration, taking into account of polarities of charges. As an example, when the donor concentration is $N_D$ and the acceptor concentration is $N_A$, the net doping concentration at any position is given as $N_D-N_A$. In the present specification, the net doping concentration may be simply referred to as the doping concentration.

The donor has the function of supplying electrons to a semiconductor. The acceptor has the function of receiving electrons from the semiconductor. The donor and the acceptor are not limited to the impurities themselves. For example, a VOH defect which is a combination of a vacancy (V), oxygen (O), and hydrogen (H) existing in the semiconductor functions as the donor that supplies electrons. In the present specification, the VOH defect may be referred to as a hydrogen donor.

In the present specification, a description of a P+ type or an N+ type means a higher doping concentration than the P type or the N type, and a description of a P− type or an N− type means a lower doping concentration than the P type or the N type. Further, in the present specification, a description of a P++ type or an N++ type means a higher doping concentration than the P+ type or the N+ type. In the present specification, a unit system is the SI base unit system unless otherwise particularly noted. Although a unit of length may be expressed in cm, calculations may be carried out after conversion to meters (m).

A chemical concentration in the present specification refers to an atomic density of an impurity measured regardless of an electrical activation state. The chemical concentration (atomic density) can be measured by, for example, secondary ion mass spectrometry (SIMS). The net doping concentration described above can be measured by voltage-capacitance profiling (CV method). Further, a carrier concentration measured by spreading resistance profiling (SRP method) may be set as the net doping concentration. The carrier concentration measured by the CV method or the SRP method may be a value in a thermal equilibrium state. Further, in a region of the N type, the donor concentration is sufficiently higher than the acceptor concentration, and thus the carrier concentration of the region may be set as the donor concentration. Similarly, in a region of the P type, the carrier concentration of the region may be set as the acceptor concentration. In the present specification, the doping concentration of an N type region may be referred to as the donor concentration, and the doping concentration of a P type region may be referred to as the acceptor concentration.

Further, when a concentration distribution of the donor, acceptor, or net doping has a peak in a region, a value of the peak may be set as the concentration of the donor, acceptor, or net doping in the region. If the concentration of the donor, acceptor or net doping is substantially uniform in a region, or the like, an average value of the concentration of the donor, acceptor or net doping in the region may be set as the concentration of the donor, acceptor or net doping. In the present specification, atoms/cm$^3$ or/cm$^3$ is used to express a concentration per unit volume. This unit is used for the donor or acceptor concentration, or the chemical concentration in the semiconductor substrate. A notation of atoms may be omitted.

The carrier concentration measured by the SRP method may be lower than the concentration of the donor or the acceptor. In a range where a current flows when a spreading resistance is measured, the carrier mobility of the semiconductor substrate may be lower than a value of that in a crystalline state. The reduction in carrier mobility occurs when carriers are scattered due to disorder (disorder) of a crystal structure due to a lattice defect or the like.

The concentration of the donor or the acceptor calculated from the carrier concentration measured by the CV method or the SRP method may be lower than a chemical concentration of an element indicating the donor or the acceptor. As an example, in a silicon semiconductor, a donor concentration of phosphorous or arsenic serving as a donor, or an acceptor concentration of boron (boron) serving as an acceptor is substantially 99% of chemical concentrations of these. On the other hand, in the silicon semiconductor, a donor concentration of hydrogen serving as a donor is substantially 0.1% to 10% of a chemical concentration of hydrogen. Each concentration in the present specification may be a value at room temperature. As an example, a value at 300K (Kelvin) (substantially 26.9 degrees C.) may be used for a value at room temperature.

FIG. 1 is a top view showing an example of a semiconductor device 100. FIG. 1 shows a position at which each member is projected on an upper surface of a semiconductor substrate 10. FIG. 1 shows merely some members of the semiconductor device 100, and omits illustrations of some members.

The semiconductor device 100 includes a semiconductor substrate 10. The semiconductor substrate 10 is a substrate that is formed of semiconductor material. Although the semiconductor substrate 10 is a silicon substrate by way of example, the material of the semiconductor substrate 10 is not limited to silicon.

The semiconductor substrate 10 has an end side 162 in a top view. When the top view is simply mentioned in the present specification, it means that the semiconductor substrate 10 is viewed from an upper surface side. The semiconductor substrate 10 of this example has two sets of end sides 162 opposite to each other in the top view. In FIG. 1, the X axis and the Y axis are parallel to any of the end sides 162. In addition, the Z axis is perpendicular to the upper surface of the semiconductor substrate 10.

The semiconductor substrate 10 is provided with an active portion 160. The active portion 160 is a region where the main current flows in the depth direction between the upper surface and the lower surface of the semiconductor substrate 10 when the semiconductor device 100 operates. An emitter electrode is provided above the active portion 160, but is omitted in FIG. 1.

The active portion 160 is provided with at least one of a transistor portion 70 including a transistor element such as an IGBT, and a diode portion 80 including a diode element such as a freewheeling diode (FWD). In the example of FIG. 1, the transistor portion 70 and the diode portion 80 are alternately arranged along a predetermined array direction (the X axis direction in this example) on the upper surface of the semiconductor substrate 10. In another example, the active portion 160 may be provided with only one of the transistor portion 70 and the diode portion 80.

In FIG. 1, a region where each of the transistor portions 70 is arranged is indicated by a symbol "I", and a region where each of the diode portions 80 is arranged is indicated by a symbol F. In the present specification, a direction perpendicular to the array direction in the top view may be referred to as an extending direction (the Y axis direction in FIG. 1). Each of the transistor portions 70 and the diode portions 80 may have a longitudinal length in the extending direction. In other words, the length of each of the transistor portions 70 in the Y axis direction is larger than the width in the X axis direction. Similarly, the length of each of the diode portions 80 in the Y axis direction is larger than the width in the X axis direction. The extending direction of the transistor portion 70 and the diode portion 80, and the longitudinal direction of each trench portion described later may be the same.

Each of the diode portions 80 includes a cathode region of N+ type in a region in contact with the lower surface of the semiconductor substrate 10. In the present specification, a region where the cathode region is provided is referred to as the diode portion 80. In other words, the diode portion 80 is a region that overlaps with the cathode region in the top view. On the lower surface of the semiconductor substrate 10, a collector region of P+ type may be provided in a region other than the cathode region. In the present specification, the diode portion 80 may also include an extension region 81 where the diode portion 80 extends to a gate runner described below in the Y axis direction. The collector region is provided on a lower surface of the extension region 81.

The transistor portion 70 has the collector region of the P+ type in a region in contact with the lower surface of the semiconductor substrate 10. Further, in the transistor portion 70, an emitter region of the N type, a base region of the P type, and a gate structure having a gate conductive portion and a gate dielectric film are periodically arranged on the upper surface side of the semiconductor substrate 10.

The semiconductor device 100 may have one or more pads above the semiconductor substrate 10. The semiconductor device 100 of this example has a gate pad 164. The semiconductor device 100 may have a pad such as an anode pad, a cathode pad, and a current detection pad. Each pad is arranged in a region close to the end side 162. The region close to the end side 162 refers to a region between the end side 162 and the emitter electrode in the top view. When the semiconductor device 100 is mounted, each pad may be connected to an external circuit via wiring such as a wire.

A gate potential is applied to the gate pad 164. The gate pad 164 is electrically connected to a conductive portion of a gate trench portion of the active portion 160. The semiconductor device 100 includes a gate runner that connects the gate pad 164 and the gate trench portion. In FIG. 1, the gate runner is hatched with diagonal lines.

The gate runner of this example has an outer circumferential gate runner 130 and an active-side gate runner 131. The outer circumferential gate runner 130 is arranged between the active portion 160 and the end side 162 of the semiconductor substrate 10 in the top view. The outer circumferential gate runner 130 of this example encloses the active portion 160 in the top view. A region enclosed by the outer circumferential gate runner 130 in the top view may be the active portion 160. Further, the outer circumferential gate runner 130 is connected to the gate pad 164. The outer circumferential gate runner 130 is arranged above the semiconductor substrate 10. The outer circumferential gate runner 130 may be metal wiring including aluminum and the like.

The active-side gate runner 131 is provided in the active portion 160. Providing the active-side gate runner 131 in the active portion 160 can reduce a variation in wiring length from the gate pad 164 for each region of the semiconductor substrate 10.

The active-side gate runner 131 is connected to the gate trench portion of the active portion 160. The active-side gate runner 131 is arranged above the semiconductor substrate 10. The active-side gate runner 131 may be a wiring formed of a semiconductor such as polysilicon doped with an impurity.

The active-side gate runner 131 may be connected to the outer circumferential gate runner 130. The active-side gate runner 131 of this example is provided extending in the X axis direction so as to cross the active portion 160 from one outer circumferential gate runner 130 to the other outer circumferential gate runner 130 substantially at the center of the Y axis direction. When the active portion 160 is divided by the active-side gate runner 131, the transistor portion 70 and the diode portion 80 may be alternately arranged in the X axis direction in each divided region.

Further, the semiconductor device 100 may include a temperature sensing portion (not shown) that is a PN junction diode formed of polysilicon or the like, and a current detection portion (not shown) that simulates an operation of the transistor portion provided in the active portion 160.

The semiconductor device 100 of this example includes an edge termination structure portion 90 between the active portion 160 and the end side 162 in the top view. The edge termination structure portion 90 of this example is arranged between the outer circumferential gate runner 130 and the end side 162. The edge termination structure portion 90 reduces an electric field strength on the upper surface side of the semiconductor substrate 10. The edge termination structure portion 90 may include at least one of a guard ring, a field plate, and a RESURF which are annularly provided to enclose the active portion 160.

Figure 2:
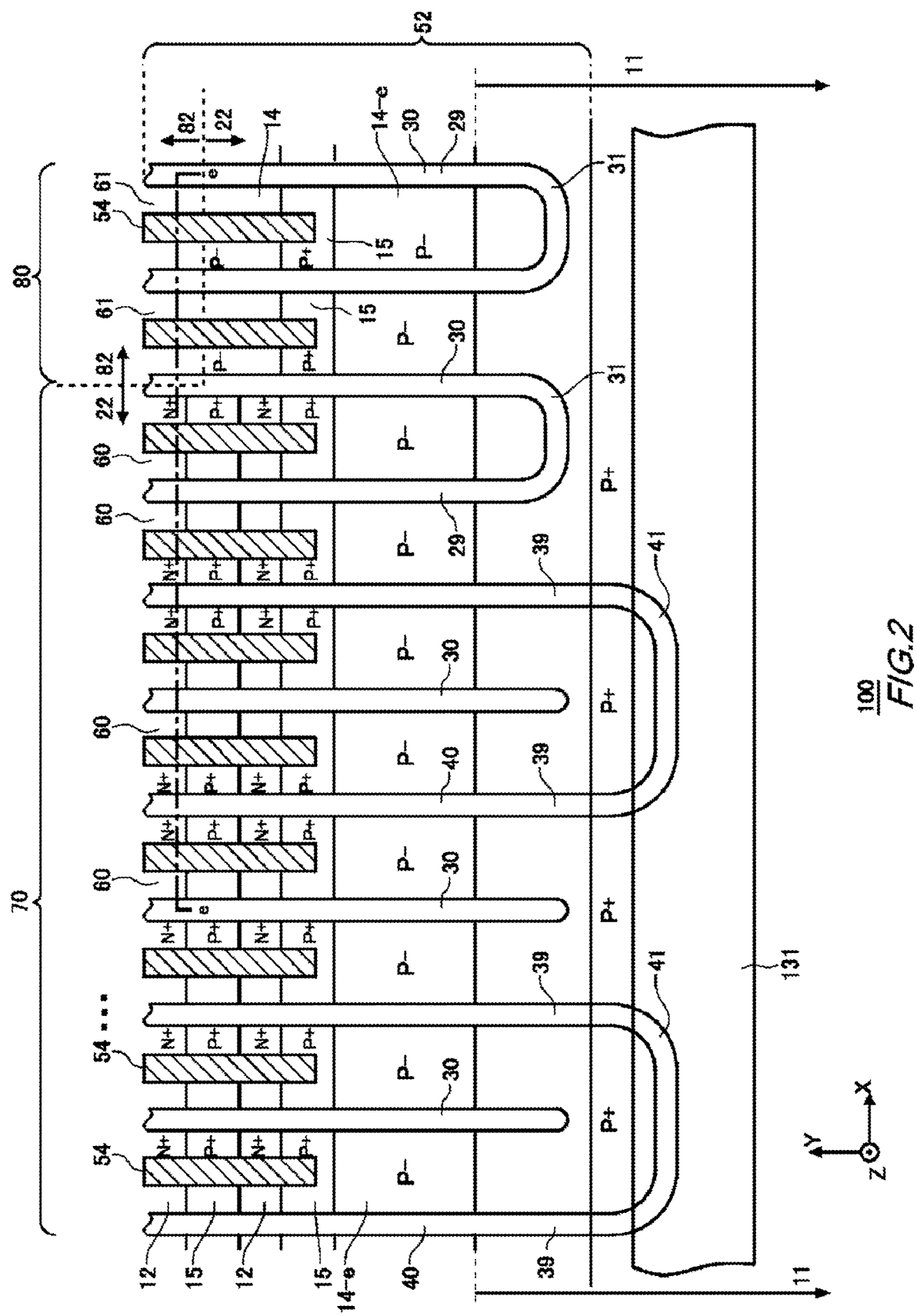
FIG. 2 is an enlarged view of a region D in FIG. 1.

FIG. 2 illustrates an enlarged view of a region D in FIG. 1. The region D is a region including the transistor portion 70, the diode portion 80, and the active-side gate runner 131. The semiconductor device 100 of this example includes a gate trench portion 40, a dummy trench portion 30, a well region 11, an emitter region 12, a base region 14, and a contact region 15 which are provided inside the upper surface side of the semiconductor substrate 10. The gate trench portion 40 and the dummy trench portion 30 each are an example of the trench portion. Further, the semiconductor device 100 of this example includes an emitter electrode 52 and the active-side gate runner 131 that are provided above the upper surface of the semiconductor substrate 10. The emitter electrode 52 and the active-side gate runner 131 are provided separately from each other.

An interlayer dielectric film is provided between the emitter electrode 52 and the active-side gate runner 131, and the upper surface of the semiconductor substrate 10, but the interlayer dielectric film is omitted in FIG. 2. In the interlayer dielectric film of this example, a contact hole 54 is provided passing through the interlayer dielectric film. In FIG. 2, each contact hole 54 is hatched with the diagonal lines.

The emitter electrode 52 is provided above the gate trench portion 40, the dummy trench portion 30, the well region 11, the emitter region 12, the base region 14, and the contact region 15. The emitter electrode 52 is in contact with the emitter region 12, the contact region 15, and the base region 14 on the upper surface of the semiconductor substrate 10, through the contact hole 54. Further, the emitter electrode 52 is connected to a dummy conductive portion in the dummy trench portion 30 through the contact hole provided in the interlayer dielectric film. The emitter electrode 52 may be connected to the dummy conductive portion of the dummy trench portion 30 at an edge of the dummy trench portion 30 in the Y axis direction.

The active-side gate runner 131 is connected to the gate trench portion 40 through the contact hole provided in the interlayer dielectric film. The active-side gate runner 131 may be connected to a gate conductive portion of the gate trench portion 40 at an edge portion 41 of the gate trench portion 40 in the Y axis direction. The active-side gate runner 131 is not connected to the dummy conductive portion in the dummy trench portion 30.

The emitter electrode 52 is formed of a material including metal. FIG. 2 shows a range where the emitter electrode 52 is provided. For example, at least a part of a region of the emitter electrode 52 is formed of aluminum or an aluminum-silicon alloy, for example, a metal alloy such as AlSi, AlSiCu. The emitter electrode 52 may have a barrier metal formed of titanium, a titanium compound, or the like in a layer below a region formed of aluminum or the like. Further, a plug, which is formed by embedding tungsten or the like so as to be in contact with the barrier metal and aluminum or the like, may be included in the contact hole.

The well region 11 is provided overlapping the active-side gate runner 131. The well region 11 is provided so as to extend with a predetermined width even in a range not overlapping the active-side gate runner 131. The well region 11 of this example is provided away from an end of the contact hole 54 in the Y axis direction toward the active-side gate runner 131 side. The well region 11 is a second conductivity type region in which the doping concentration is higher than the base region 14. The base region 14 of this example is a P− type, and the well region 11 is a P+ type.

Each of the transistor portion 70 and the diode portion 80 includes a plurality of trench portions arranged in the array direction. In the transistor portion 70 of this example, one or more gate trench portions 40 and one or more dummy trench portions 30 are alternately provided along the array direction. In the diode portion 80 of this example, the plurality of dummy trench portions 30 are provided along the array direction. In the diode portion 80 of this example, the gate trench portion 40 is not provided.

The gate trench portion 40 of this example may have two linear portions 39 extending along the extending direction perpendicular to the array direction (portions of a trench that are linear along the extending direction), and the edge portion 41 connecting the two linear portions 39. The extending direction in FIG. 2 is the Y axis direction.

At least a part of the edge portion 41 is preferably provided in a curved shape in a top view. By connecting between end portions of the two linear portions 39 in the Y axis direction by the edge portion 41, it is possible to reduce the electric field strength at the end portions of the linear portions 39.

In the transistor portion 70, the dummy trench portions 30 are provided between the respective linear portions 39 of the gate trench portions 40. Between the respective linear portions 39, one dummy trench portion 30 may be provided or a plurality of dummy trench portions 30 may be provided. The dummy trench portion 30 may have a linear shape extending in the extending direction, and may have linear portions 29 and an edge portion 31, similarly to the gate trench portion 40. The semiconductor device 100 shown in FIG. 2 includes both of the linear dummy trench portion 30 having no edge portion 31, and the dummy trench portion 30 having the edge portion 31.

A diffusion depth of the well region 11 may be deeper than the depth of the gate trench portion 40 and the dummy trench portion 30. The end portions in the Y axis direction of the gate trench portion 40 and the dummy trench portion 30 are provided in the well region 11 in a top view. In other words, the bottom in the depth direction of each trench portion is covered with the well region 11 at the end portion in the Y axis direction of each trench portion. In this manner, the electric field strength on the bottom portion of each trench portion can be reduced.

A mesa portion is provided between the respective trench portions in the array direction. The mesa portion refers to a region sandwiched between the trench portions inside the semiconductor substrate 10. As an example, an upper end of the mesa portion is the upper surface of the semiconductor substrate 10. The depth position of the lower end of the mesa portion is the same as the depth position of the lower end of the trench portion. The mesa portion of this example is provided extending in the extending direction (the Y axis direction) along the trench portion, on the upper surface of the semiconductor substrate 10. In this example, a mesa portion 60 is provided in the transistor portion 70, and a mesa portion 61 is provided in the diode portion 80. In the case of simply mentioning "mesa portion" in the present specification, the portion refers to each of the mesa portion 60 and the mesa portion 61.

Each mesa portion is provided with the base region 14. In the mesa portion, a region arranged closest to the active-side gate runner 131, in the base region 14 exposed on the upper surface of the semiconductor substrate 10, is to be a base region 14-e. While FIG. 2 shows the base region 14-e arranged at one end portion of each mesa portion in the extending direction, the base region 14-e is also arranged at the other end portion of each mesa portion. Each mesa portion may be provided with at least one of a first conductivity type of emitter region 12, and a second conductivity type of contact region 15 in a region sandwiched between the base regions 14-e in the top view. The emitter region 12 of this example is an N+ type, and the contact region 15 is a P+ type. The emitter region 12 and the contact region 15 may be provided between the base region 14 and the upper surface of the semiconductor substrate 10 in the depth direction.

The mesa portion 60 of the transistor portion 70 has the emitter region 12 exposed on the upper surface of the semiconductor substrate 10. The emitter region 12 is provided in contact with the gate trench portion 40. The mesa portion 60 in contact with the gate trench portion 40 may be provided with the contact region 15 exposed on the upper surface of the semiconductor substrate 10.

Each of the contact region 15 and the emitter region 12 in the mesa portion 60 is provided from one trench portion to the other trench portion in the X axis direction. As an example, the contact region 15 and the emitter region 12 in the mesa portion 60 are alternately arranged along the extending direction of the trench portion (the Y axis direction).

In another example, the contact region 15 and the emitter region 12 in the mesa portion 60 may be provided in a stripe shape along the extending direction of the trench portion (the Y axis direction). For example, the emitter region 12 is provided in a region in contact with the trench portion, and the contact region 15 is provided in a region sandwiched between the emitter regions 12.

The mesa portion 61 of the diode portion 80 is not provided with the emitter region 12. The base region 14 and the contact region 15 may be provided on an upper surface of the mesa portion 61. In the region sandwiched between the base regions 14-e on the upper surface of the mesa portion 61, the contact region 15 may be provided in contact with each base region 14-e. The base region 14 may be provided in a region sandwiched between the contact regions 15 on the upper surface of the mesa portion 61. The base region 14 may be arranged in the entire region sandwiched between the contact regions 15.

The contact hole 54 is provided above each mesa portion. The contact hole 54 is arranged in the region sandwiched between the base regions 14-e. The contact hole 54 of this example is provided above respective regions of the contact region 15, the base region 14, and the emitter region 12. The contact hole 54 is not provided in regions corresponding to the base region 14-e and the well region 11. The contact hole 54 may be arranged at the center of the mesa portion 60 in the array direction (the X axis direction).

In the diode portion 80, a cathode region 82 of the N+ type is provided in a region in direct contact with the lower surface of the semiconductor substrate 10. On the lower surface of the semiconductor substrate 10, a collector region of the P+ type 22 may be provided in a region where the cathode region 82 is not provided. The cathode region 82 and the collector region 22 are provided between a lower surface 23 of the semiconductor substrate 10 and a buffer region 20. In FIG. 2, a boundary between the cathode region 82 and the collector region 22 is indicated by a dotted line.

The cathode region 82 is arranged away from the well region 11 in the Y axis direction. In this manner, the distance between the P type region (the well region 11) having a relatively high doping concentration and formed up to the deep position, and the cathode region 82 is ensured, so that the breakdown voltage can be improved. The end portion in the Y axis direction of the cathode region 82 of this example is arranged farther away from the well region 11 than the end portion in the Y axis direction of the contact hole 54. In another example, the end portion in the Y axis direction of the cathode region 82 may be arranged between the well region 11 and the contact hole 54.

Figure 3:
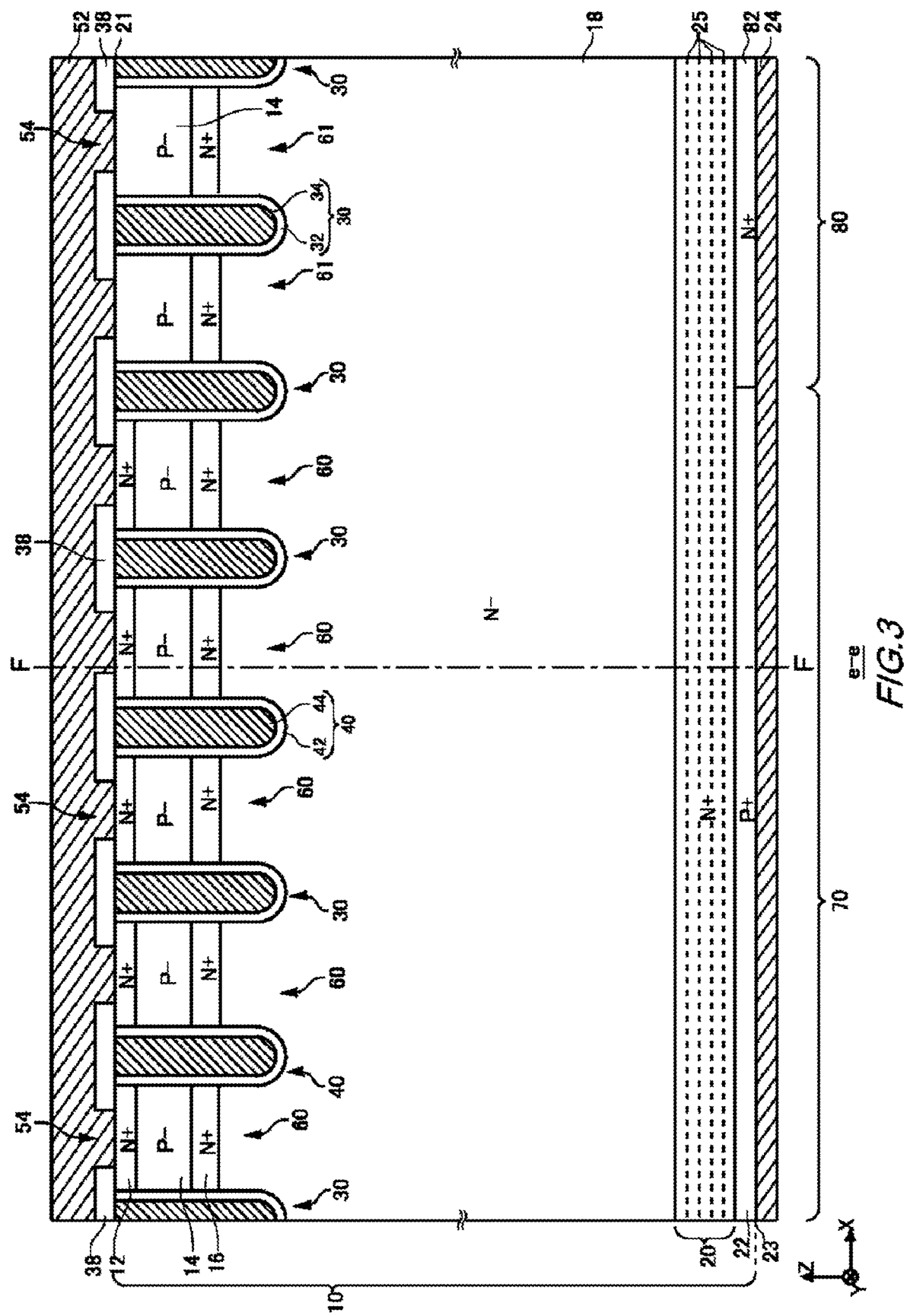
FIG. 3 illustrates an example of a cross section e-e in FIG. 2.

FIG. 3 illustrates a view showing an example of a cross section e-e in FIG. 2. The cross section e-e is an XZ plane passing through the emitter region 12 and the cathode region 82. The semiconductor device 100 of this example includes the semiconductor substrate 10, the interlayer dielectric film 38, the emitter electrode 52, and the collector electrode 24 in the cross section.

The interlayer dielectric film 38 is provided on the upper surface of the semiconductor substrate 10. The interlayer dielectric film 38 is a film including at least one layer of a dielectric film such as silicate glass to which an impurity such as boron or phosphorous is added, a thermal oxide film, and other dielectric films. The interlayer dielectric film 38 is provided with the contact hole 54 described in FIG. 2.

The emitter electrode 52 is provided above the interlayer dielectric film 38. The emitter electrode 52 is in contact with an upper surface 21 of the semiconductor substrate 10 through the contact hole 54 of the interlayer dielectric film 38. The collector electrode 24 is provided on a lower surface 23 of the semiconductor substrate 10. The emitter electrode 52 and the collector electrode 24 are formed of a metal material such as aluminum. In the present specification, the direction in which the emitter electrode 52 is connected to the collector electrode 24 (the Z axis direction) is referred to as a depth direction.

The semiconductor substrate 10 includes an N type or N− type drift region 18. The drift region 18 is provided in each of the transistor portion 70 and the diode portion 80.

In the mesa portion 60 of the transistor portion 70, an N+ type of emitter region 12 and a P− type of base region 14 are provided in order from an upper surface 21 side of the semiconductor substrate 10. The drift region 18 is provided below the base region 14. The mesa portion 60 may be provided with an N+ type of accumulation region 16. The accumulation region 16 is arranged between the base region 14 and the drift region 18.

The emitter region 12 is exposed on the upper surface 21 of the semiconductor substrate 10 and is provided in contact with gate trench portion 40. The emitter region 12 may be in contact with the trench portions on both sides of the mesa portion 60. The emitter region 12 has a higher doping concentration than the drift region 18.

The base region 14 is provided below the emitter region 12. The base region 14 of this example is provided in contact with the emitter region 12. The base region 14 may be in contact with the trench portions on both sides of the mesa portion 60.

The accumulation region 16 is provided below the base region 14. The accumulation region 16 is an N+ type region with a higher doping concentration than the drift region 18. The accumulation region 16 may have a concentration peak of a donor such as a phosphorous or hydrogen donor. By providing the accumulation region 16 having the high concentration between the drift region 18 and the base region 14, it is possible to improve a carrier injection enhancement effect (IE effect) and reduce an on-voltage. The accumulation region 16 may be provided to cover a whole lower surface of the base region 14 in each mesa portion 60.

The mesa portion 61 of the diode portion 80 is provided with the P− type of base region 14 in contact with the upper surface 21 of the semiconductor substrate 10. The drift region 18 is provided below the base region 14. In the mesa portion 61, the accumulation region 16 may be provided below the base region 14.

In each of the transistor portion 70 and the diode portion 80, an N+ type buffer region 20 may be provided below the drift region 18. The doping concentration of the buffer region 20 is higher than the doping concentration of the drift region 18. The buffer region 20 has a concentration peak 25 having a higher doping concentration than the drift region 18. The doping concentration of the concentration peak 25 refers to a doping concentration at the local maximum of the concentration peak 25. Further, as the doping concentration of the drift region 18, an average value of doping concentrations in the region where the doping concentration distribution is substantially flat may be used.

In the buffer region 20 of this example, the doping concentration distribution of the semiconductor substrate 10 in the depth direction (Z axis direction) has three or more concentration peaks 25. The concentration peak 25 of the buffer region 20 may form an N type dopant such as hydrogen (proton) or phosphorous by ion implantation. The concentration peak 25 of the buffer region 20 may be provided at the same depth position as, for example, a concentration peak of hydrogen (a proton) or phosphorous. The buffer region 20 may function as a field stopper layer which prevents a depletion layer expanding from the lower end of the base region 14 from reaching the collector region 22 of the P+ type and the cathode region 82 of the N+ type.

In the transistor portion 70, the collector region of the P+ type 22 is provided below the buffer region 20. An acceptor concentration of the collector region 22 is higher than an acceptor concentration of the base region 14. The collector region 22 may include an acceptor which is the same as or different from an acceptor of the base region 14. The acceptor of the collector region 22 is, for example, boron.

Below the buffer region 20 in the diode portion 80, the cathode region 82 of the N+ type is provided. A donor concentration of the cathode region 82 is higher than a donor concentration of the drift region 18. A donor of the cathode region 82 is, for example, hydrogen or phosphorous. It is noted that an element serving as a donor and an acceptor in each region is not limited to the above-described example. The collector region 22 and the cathode region 82 are exposed on the lower surface 23 of the semiconductor substrate 10 and are connected to the collector electrode 24. The collector electrode 24 may be in contact with the entire lower surface 23 of the semiconductor substrate 10. The emitter electrode 52 and the collector electrode 24 are formed of a metal material such as aluminum.

One or more gate trench portions 40 and one or more dummy trench portions 30 are provided on the upper surface 21 side of the semiconductor substrate 10. Each trench portion passes through the base region 14 from the upper surface 21 of the semiconductor substrate 10 and reaches the drift region 18. In a region where at least any one of the emitter region 12, the contact region 15, and the accumulation region 16 is provided, each trench portion also passes through the doping regions of these to reach the drift region 18. The configuration of the trench portion passing through the doping region is not limited to the one manufactured in the order of forming the doping region and then forming the trench portion. The configuration of the trench portion passing through the doping region includes a configuration of the doping region being formed between the trench portions after forming the trench portion.

As described above, the transistor portion 70 is provided with the gate trench portion 40 and the dummy trench portion 30. In the diode portion 80, the dummy trench portion 30 is provided, and the gate trench portion 40 is not provided. The boundary in the X axis direction between the diode portion 80 and the transistor portion 70 in this example is the boundary between the cathode region 82 and the collector region 22.

The gate trench portion 40 includes a gate trench provided in the upper surface 21 of the semiconductor substrate 10, a gate dielectric film 42, and a gate conductive portion 44. The gate dielectric film 42 is provided to cover the inner wall of the gate trench. The gate dielectric film 42 may be formed by oxidizing or nitriding a semiconductor on the inner wall of the gate trench. The gate conductive portion 44 is provided on the inner side of the gate dielectric film 42 in the gate trench. That is, the gate dielectric film 42 insulates the gate conductive portion 44 from the semiconductor substrate 10. The gate conductive portion 44 is formed of a conductive material such as polysilicon.

The gate conductive portion 44 may be provided longer than the base region 14 in the depth direction. The gate trench portion 40 in the cross section is covered by the interlayer dielectric film 38 on the upper surface 21 of the semiconductor substrate 10. The gate conductive portion 44 is electrically connected to the gate runner. When a predetermined gate voltage is applied to the gate conductive portion 44, a channel is formed by an electron inversion layer in a surface layer of the base region 14 at a boundary in contact with the gate trench portion 40.

The dummy trench portions 30 may have the same structure as the gate trench portions 40 in the cross section. The dummy trench portion 30 includes a dummy trench provided in the upper surface 21 of the semiconductor substrate 10, a dummy dielectric film 32, and a dummy conductive portion 34. The dummy conductive portion 34 is electrically connected to the emitter electrode 52. The dummy dielectric film 32 is provided covering an inner wall of the dummy trench. The dummy conductive portion 34 is provided in the dummy trench, and is provided on the inner side of the dummy dielectric film 32. The dummy dielectric film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon or the like. The dummy conductive portion 34 may have the same length as the gate conductive portion 44 in the depth direction.

The gate trench portion 40 and the dummy trench portion 30 of this example are covered with the interlayer dielectric film 38 on the upper surface 21 of the semiconductor substrate 10. It is noted that the bottoms of the dummy trench portion 30 and the gate trench portion 40 may be formed in a curved-surface shape (a curved shape in the cross section) convexly downward.

Figure 4:
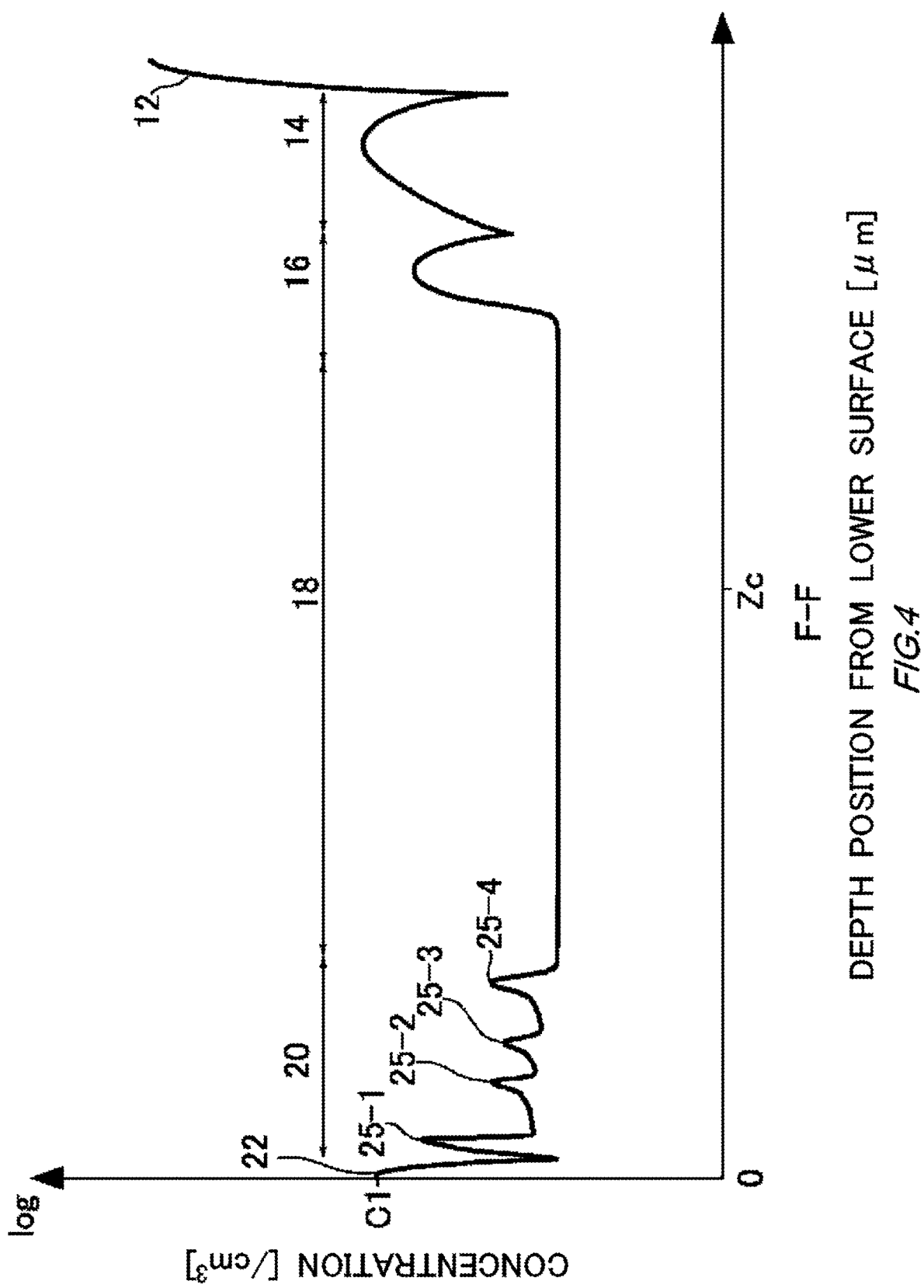
FIG. 4 illustrates an example of a doping concentration distribution in a depth direction at a position of a line F-F of FIG. 3.

FIG. 4 illustrates an example of a doping concentration distribution in a depth direction at a position of a line F-F of FIG. 3. The vertical axis of FIG. 4 is a logarithmic axis. In FIG. 4, the center position of the semiconductor substrate 10 in the depth direction is Zc.

The emitter region 12 has a concentration peak of an N type dopant. The N type dopant is, for example, phosphorous, but it is not limited thereto. The base region 14 has a concentration peak of a P type dopant. The P type dopant is, for example, boron, but it is not limited thereto. The accumulation region 16 has a concentration peak of an N type dopant. The N type dopant is, for example, hydrogen or phosphorous, but it is not limited thereto.

The drift region 18 may have a flat region where the doping concentration is substantially constant. A flat region is a portion of continuous regions having a doping concentration between a predetermined maximum value max and a predetermined minimum value min, in the depth direction. For the maximum value max, a maximum value of the doping concentration in the region may be used. The minimum value min may be a value 50%, may be a value 70%, and may be a value 90% of the maximum value max.

Alternatively, a value of the doping concentration distribution in a flat region may be within ±50%, within ±30%, or within ±10% of an average concentration of a doping concentration distribution in a predetermined range in the depth direction, A doping concentration of the drift region 18 may be identical to a bulk donor concentration. N type bulk donors are distributed throughout the semiconductor substrate 10 of this example. The bulk donor is a dopant donor substantially uniformly contained in an ingot during the manufacture of the ingot from which the semiconductor substrate 10 is made. The bulk donor of this example is an element other than hydrogen. The dopant of the bulk donor is, for example, an element of group V or group VI, and is, for example, but not limited to, phosphorous, antimony, arsenic, selenium, or sulfur. The bulk donor of this example is phosphorous. The bulk donor is also contained in the P type region. The semiconductor substrate 10 may be a wafer which has been cut out from a semiconductor ingot, or may be a chip into which a wafer is singulated. The semiconductor ingot may be manufactured by any of a Czochralski method (CZ method), a magnetic-field applied Czochralski method (MCZ method), or a float zone method (FZ method). The ingot of this example is manufactured by the MCZ method.

An oxygen chemical concentration contained in a substrate manufactured by the MCZ method is, as an example, $1\times10^{17}$~$7\times10^{17}$ atoms/cm$^3$. An oxygen chemical concentration contained in a substrate manufactured by the FZ method is, as an example, $1\times10^{15}$~$5\times10^{16}$ atoms/cm$^3$. A chemical concentration of a bulk donor distributed throughout the semiconductor substrate 10 may be used for the bulk donor concentration, which may also be a value from 90% to 100% of the chemical concentration. In a semiconductor substrate where a dopant of a group V or group VI, such as phosphorous, is doped, the bulk donor concentration may be $1\times10^{11}$/cm$^3$ or more and $3\times10^{14}$/cm$^3$ or less. A bulk donor concentration of a semiconductor substrate where a dopant of a group V or group VI is doped is preferably $1\times10^{12}$/cm$^3$ or more and $2\times10^{14}$/cm$^3$ or less. Further, for the semiconductor substrate 10, a non-doped substrate which does not contain a dopant such as phosphorous may be used. In this case, a bulk donor concentration ($N_{B0}$) of the non-doped substrate is, for example, $1\times10^{10}$/cm$^3$ or more and $5\times10^{12}$/cm$^3$ or less. The bulk donor concentration ($N_{B0}$) of the non-doped substrate is preferably $1\times10^{11}$/cm$^3$ or more. The bulk donor concentration ($N_{B0}$) of the non-doped substrate is preferably $5\times10^{12}$/cm$^3$ or less.

The drift region 18 may have a region where a doping concentration is higher than the bulk donor concentration. When charged particles such as helium ions, hydrogen ions, or electrons are radiated to the semiconductor substrate 10, due to the charged particles having passed, lattice defects mainly composed of vacancies such as monatomic vacancies (V) and diatomic vacancies (VV), are formed in a passed-through region, through which the charged particles has passed. Atoms adjacent to the vacancies have dangling bonds. Although lattice defects may include interstitial atoms, dislocations or the like, and in a broad sense, may include donors and acceptors, in the present specification, lattice defects mainly composed of vacancies may be referred to as vacancy-type lattice defects, vacancy-type defects, or merely lattice defects. Further, because many lattice defects are formed due to the implantation of charged particles into the semiconductor substrate 10, the crystallinity of the semiconductor substrate 10 may be strongly disturbed. In the present specification, this disorder of crystallinity may be referred to as a disorder.

Further, throughout the semiconductor substrate 10, oxygen is contained. The oxygen is intentionally or unintentionally introduced during the manufacture of a semiconductor ingot. Further, at least some regions among passed-through regions of charged particles may contain hydrogen. The hydrogen may be implanted intentionally inside the semiconductor substrate 10. For example, hydrogen ions may be implanted to form a concentration peak 25 of the buffer region 20. By the diffusion of the hydrogen implanted to the buffer region 20 through heat treatment or the like, hydrogen (H), vacancies (V), and oxygen (O) are attached to form VOH defects inside the semiconductor substrate 10.

A VOH defect functions as a donor to supply electrons. In the present specification, the VOH defect may merely be referred to as a hydrogen donor. Forming a hydrogen donor in the semiconductor substrate 10 enables the donor concentration in a passed-through region of charged particles to be higher than the bulk donor concentration. Normally, it is necessary to prepare the semiconductor substrate 10 to have a predetermined bulk donor concentration in accordance with a characteristic, especially rated voltage or breakdown voltage, of an element to be formed in the semiconductor substrate 10. In contrast, in a case where a hydrogen donor is formed, the donor concentration of the semiconductor substrate 10 can be adjusted by controlling dose amount of charged particles. Therefore, the semiconductor device 100 can be manufactured using a semiconductor substrate having a bulk donor concentration not corresponding to a characteristic or the like of an element. While the bulk donor concentration during the manufacture of the semiconductor substrate 10 relatively largely varies, the dose amount of charged particles can be controlled with relatively high precision. Therefore, a concentration of the lattice defects caused by the implantation of charged particles can also be controlled with high precision, and a donor concentration of a passed-through region can be controlled with high precision.

The doping concentration distribution in the buffer region 20 of this example has a plurality of concentration peaks 25 provided at different positions in the depth direction. The concentration peak 25 is a peak of the donor concentration. The concentration peak 25 may have hydrogen as an impurity, and may have hydrogen donor as a donor. Providing the plurality of concentration peaks 25 can prevent the depletion layer from reaching the collector region 22 better.

An example of FIG. 4 illustrates a concentration peak 25-1 closest to the lower surface 23, a concentration peak 25-2 second closest to the lower surface 23, a concentration peak 25-3 third closest to the lower surface 23, and a concentration peak 25-4 farthest from the lower surface 23. In another example, a quantity of the concentration peaks 25 may be three, and may be five or more.

The collector region 22 has a concentration peak of a P type dopant. The P type dopant is, for example, boron, but it is not limited thereto. A value of the concentration peak of the collector region 22 is referred to as C1. The concentration C1 may be a value of the doping concentration at a position in contact with the lower surface 23.

Figure 5:
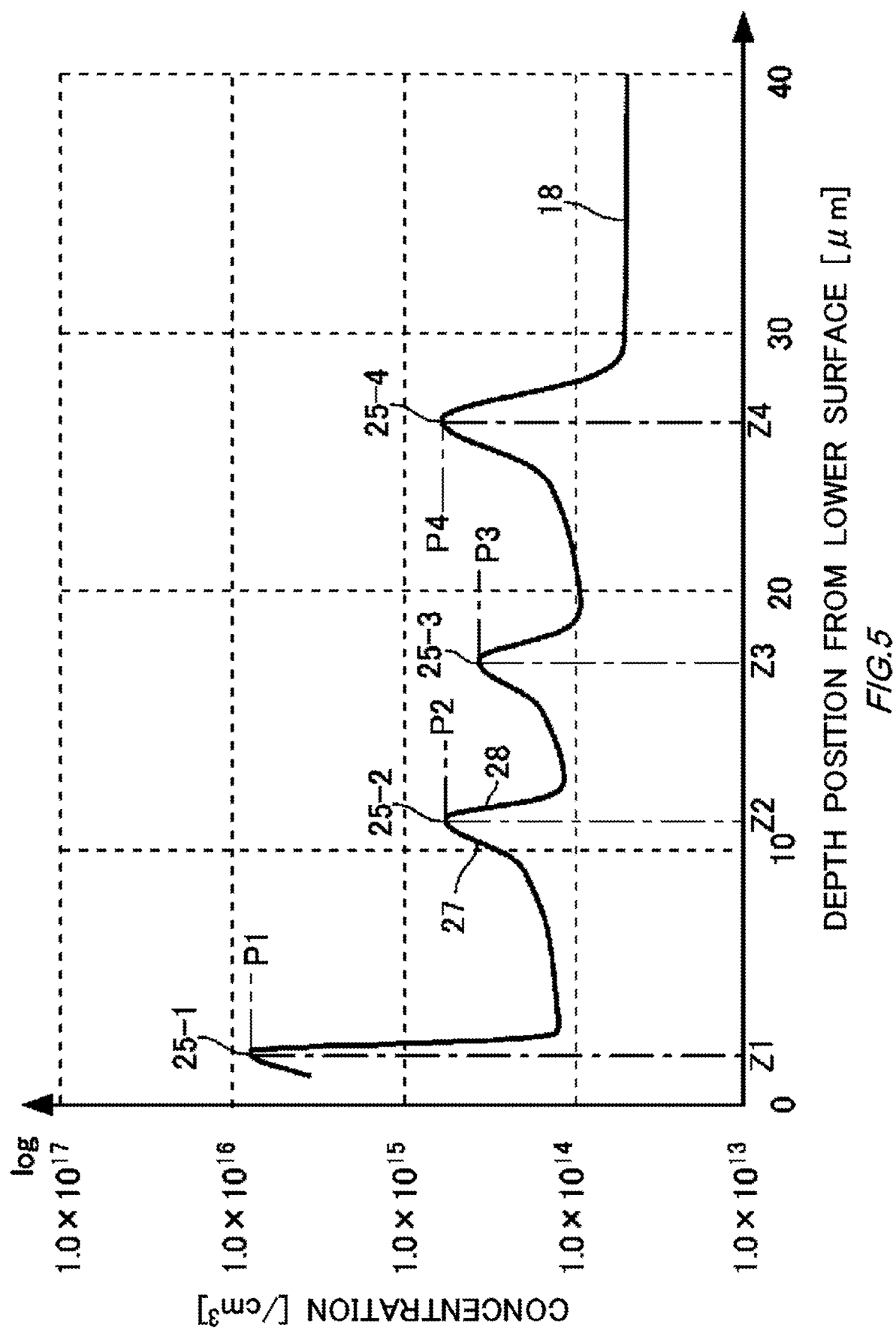
FIG. 5 is an enlarged view of a doping concentration distribution in a buffer region 20.

FIG. 5 is an enlarged view of a doping concentration distribution in the buffer region 20. The buffer region 20 has a first concentration peak 25-1, a second concentration peak 25-2, and a high concentration peak 25-4.

The first concentration peak 25-1 is a concentration peak 25 closest to the lower surface 23 in the depth direction. The first concentration peak 25-1 may be a peak where a doping concentration P1 is the largest one among the plurality of concentration peaks 25. It is noted that the doping concentration of each concentration peak 25 is a doping concentration at a local maximum of the doping concentration distribution. The doping concentration P1 may be $1.0\times10^{16}$/cm$^3$ or more, may be $5.0\times10^{15}$/cm$^3$ or more, and may be $1.0\times10^{16}$/cm$^3$ or more. The doping concentration P1 being a high concentration can prevent the depletion layer extending from a lower end of the base region 14 from reaching the collector region 22.

A doping concentration P1 of the first concentration peak 25-1 may be 0.1 times or more and 10 times or less the doping concentration C1 of the collector region 22. The doping concentration P1 may be 0.2 times or more, may be 0.5 times or more, and may be once or more the doping concentration C1. The doping concentration P1 may be five times or less, may be two times or less, may be once or less, and may be 0.5 times or less the doping concentration C1.

An effective dose amount of the dopant of the second conductivity type in the collector region 22 may be $8\times10^{12}$/cm$^2$ or less. An effective dose amount is an integrated value obtained by integrating a doping concentration in a predetermined depth range. The effective dose amount of the collector region 22 is an integrated value of a doping concentration for a range from a pn junction between a region other than the collector region 22 and the collector region 22 to the lower surface 23 where the collector region 22 is exposed. An effective dose amount may be identical to an implanted dose amount of ion implantation of a dopant, or may be less than the implanted dose amount. In this example, they are substantially identical. The effective dose amount may be calculated by integrating a doping concentration in the collector region 22 for a range from the lower surface 23 to a pn junction with a buffer layer, or may be calculated by multiplying a doping concentration of a peak by the full width at half maximum. The dose amount may be $6 \times 10^{12}/cm^2$ or less, may be $5 \times 10^{12}/cm^2$ or less, may be $3 \times 10^{12}/cm^2$ or less, may be $2 \times 10^{12}/cm^2$ or less, and may be $1 \times 10^{12}/cm^2$ or less. On the other hand, from the perspective of reducing a variation of the on-voltage, the dose amount may be $3 \times 10^{11}/cm^2$ or more, may be $5 \times 10^{11}/cm^2$ or more, may be $8 \times 10^{11}/cm^2$ or more, and may be $1 \times 10^{12}/cm^2$ or more. The depth range of the collector region 22 may be 0.1 µm or more and 0.5 µm or less.

A depth position Z1 of the first concentration peak 25-1 may be arranged 4 µm or less, may be arranged 3 µm or less, and may be arranged 2 µm or less away from the lower surface 23. Supposing that the thickness of the semiconductor substrate 10 in the depth direction is T (µm), a distance between the depth position Z1 and the lower surface 23 may be 0.04×T or less, may be 0.03×T or less, and may be 0.02×T or less.

The second concentration peak 25-2 is a concentration peak 25 closest, next to the first concentration peak 25-1, to the lower surface 23 in the depth direction. A depth position Z2 of the second concentration peak 25-2 is arranged 5 µm or more away from the lower surface 23 in the depth direction of the semiconductor substrate 10. The depth position Z2 may be arranged 7 µm or more away from, and may be arranged 10 µm or more away from the lower surface 23. Also, supposing that the thickness of the semiconductor substrate 10 in the depth direction is T (µm), the depth position Z2 may be arranged 0.05×T or more away from, may be arranged 0.07×T or more away from, and may be arranged 0.1×T or more away from the lower surface 23.

A doping concentration P2 of the second concentration peak 25-2 is lower than the doping concentration P1 of the first concentration peak 25-1. Specifically, the doping concentration P2 is less than $1.0 \times 10^{15}/cm^3$. The doping concentration P2 may be $7.0 \times 10^{14}/cm^3$ or less and may be $5.0 \times 10^{14}/cm^3$ or less. The doping concentration P2 may be 0.1 times or less the doping concentration P1 of the first concentration peak 25-1. The doping concentration P2 may be 0.07 times or less, and may be 0.05 times or less the doping concentration P1 of the first concentration peak 25-1.

If the doping concentration P2 of the second concentration peak 25-2 is high, a slope dVce/dt of a time waveform of the collector-emitter voltage Vce becomes large when the depletion layer reaches the second concentration peak 25-2 at the time of turn-off of the semiconductor device 100 or the like. When the depletion layer reaches the second concentration peak 25-2, Vce may be substantially equal to a power source voltage Vcc. If dVce/dt becomes large when Vce is sufficiently high, the latch-up withstand capability at a room temperature or the like is reduced as a result. The latch-up withstand capability is a maximum collector current amount which does not cause latch-up to occur in the semiconductor device 100 at the time of turn-off. In this example, the doping concentration P2 is less than $1.0 \times 10^{15}/cm^3$, which can suppress an increase in dVce/dt when the depletion layer reaches the second concentration peak 25-2, and the latch-up withstand capability can be improved.

The high concentration peak 25-4 is arranged farther from the lower surface 23 than the second concentration peak 25-2. In other words, the high concentration peak 25-4 is arranged closer to the upper surface 21 side than the second concentration peak 25-2. A doping concentration P4 of the high concentration peak 25-4 is higher than the doping concentration P2 of the second concentration peak 25-2. However, the doping concentration P4 of the high concentration peak 25-4 is lower than the doping concentration P1 of the first concentration peak 25-1. Providing the high concentration peak 25-4 can facilitate maintaining the integrated value of the doping concentration in the buffer region 20 even if the doping concentration P2 of the second concentration peak 25-2 is lowered. Therefore, in the buffer region 20, a function of suppressing the expansion of the depletion layer can be maintained.

The doping concentration P4 may be less than $1.0 \times 10^{15}/cm^3$. The doping concentration P4 may be $8.0 \times 10^{14}/cm^3$ or less, and may be $6.0 \times 10^{14}/cm^3$ or less. The doping concentration P4 may be 0.1 times or less the doping concentration P1 of the first concentration peak 25-1. The doping concentration P4 may be 0.08 times or less, and may be 0.06 times or less the doping concentration P1 of the first concentration peak 25-1.

Also, because the high concentration peak 25-4 is arranged closer to the upper surface 21 side than the second concentration peak 25-2, the expansion of the depletion layer can be suppressed at a position closer to the upper surface 21 side. Further, as described later, a concentration peak 25 closer to the base region 14 where the depletion layer expands has a smaller impact on dVce/dt when the depletion layer reaches the concentration peak 25. Therefore, by arranging the high concentration peak 25-4 closer to the upper surface 21 side than the second concentration peak 25-2, the increase in dVce/dt can also be suppressed.

The high concentration peak 25-4 may be a concentration peak farthest from the lower surface 23 among the plurality of concentration peaks 25 of the buffer region 20. In this case, the high concentration peak 25-4 may be in contact with the drift region 18. The depth position Z4 of the high concentration peak 25-4 may be arranged 15 µm or more away from, may be arranged 20 µm or more away from, and may be arranged 25 µm or more away from the lower surface 23. Supposing that the thickness of the semiconductor substrate 10 in the depth direction is T (µm), the depth position Z4 may be arranged 0.15×T or more away from, may be arranged 0.2×T or more away from, and may be arranged 0.25×T or more away from the lower surface 23. It is noted that the depth position Z4 may be arranged closer to the lower surface 23 side of the semiconductor substrate 10. In other words, the depth position Z4 may be arranged between the lower surface 23 and the depth position Zc. The distance between the depth position Z4 and the lower surface 23 may be 40 µm or less, and may be 30 µm or less. The distance between the depth position Z4 and the lower surface 23 may be 0.4×T or less, and may be 0.3 T or less.

Between the second concentration peak 25-2 and the high concentration peak 25-4, one or more concentration peaks 25 may be provided. In the example of FIG. 5, between the second concentration peak 25-2 and the high concentration peak 25-4, a third concentration peak 25-3 is provided. The high concentration peak 25-4 may be a concentration peak where the doping concentration is maximum among the plurality of concentration peaks 25 except for the first concentration peak 25-1. In other words, the doping concentration P3 of the third concentration peak 25-3 is lower than the doping concentration P4 of the high concentration peak 25-4. The doping concentration P3 of the third concentration peak 25-3 may be lower or higher than the doping concentration P2 of the second concentration peak 25-2.

The depth position Z3 of the third concentration peak 25-3 may be arranged 10 µm or more away from, and may be arranged 15 µm or more away from the lower surface 23. Supposing that the thickness of the semiconductor substrate 10 in the depth direction is T (µm), the depth position Z3 may be arranged 0.1×T or more away from, and may be arranged 0.15×T or more away from the lower surface 23. The distance between the depth position Z3 and the lower surface 23 may be 25 µm or less, and may be 20 µm or less. The distance between the depth position Z3 and the lower surface 23 may be 0.25×T or less, and may be 0.2×T or less.

The distance (|Z2−Z1|) between the depth position Z2 of the second concentration peak 25-2 and the depth position Z1 may be larger than the distance (|Z3−Z2|) between the depth position Z2 and the depth position Z3. In other words, between the first concentration peak 25-1 and the third concentration peak 25-3, the second concentration peak 25-2 may be arranged closer to the third concentration peak 25-3. Also, the distance between the depth position Z3 of the third concentration peak 25-3 and the depth position Z4 may be larger than the distance between the depth position Z3 and the depth position Z2. In other words, between the second concentration peak 25-2 and the high concentration peak 25-4, the third concentration peak 25-3 may arranged be closer to the second concentration peak 25-2. In this manner, a concentration peak 25 where dVce/dt is relatively more likely to become large can be arranged away from the other concentration peaks 25.

The doping concentration of each concentration peak 25 other than the first concentration peak 25-1 among the plurality of concentration peaks 25 in the buffer region 20 may be less than $1.0 \times 10^{15}/cm^3$. This can suppress the increase in the slope dVce/dt of concentration peaks 25 other than the first concentration peak 25-1. The doping concentration of concentration peaks 25 other than the first concentration peak 25-1 may be $0.9 \times 10^{15}/cm^3$ or less, may be $0.8 \times 10^{15}/cm^3$ or less, may be $0.7 \times 10^{15}/cm^3$ or less, may be $0.6 \times 10^{15}/cm^3$ or less, and may be $0.5 \times 10^{15}/cm^3$ or less.

Also, the doping concentration of concentration peaks 25 other than the first concentration peak 25-1 may be $3.0 \times 10^{14}/cm^3$ or more. The doping concentration of each concentration peak 25 is set to a fixed concentration or more, which facilitates maintaining a suppression function to suppress the expansion of the depletion layer in the buffer region 20. The doping concentration of concentration peaks 25 other than the first concentration peak 25-1 may be $4.0 \times 10^{14}/cm^3$ or more, and may be $5.0 \times 10^{14}/cm^3$ or more. As an example, the doping concentration of concentration peaks 25 other than the first concentration peak 25-1 is $3.0 \times 10^{14}/cm^3$ or more and $5.0 \times 10^{14}/cm^3$ or less.

The doping concentration P2 of the second concentration peak 25-2 may be 0.6 times or more, and 0.8 times or less the doping concentration P4 of the high concentration peak 25-4. The doping concentration P3 of the third concentration peak 25-3 may be 0.4 times or more and 0.6 times or less the doping concentration P4 of the high concentration peak 25-4. Keeping the doping concentrations of concentration peaks 25 other than the high concentration peak 25-4 having a fixed concentration or more can facilitate suppressing the expansion of the depletion layer. Also, keeping the doping concentrations of concentration peaks 25 other than the high concentration peak 25-4 having a fixed concentration or less can suppress the increase in the slope dVce/dt.

It is noted that the doping concentration distribution in the buffer region 20 has a lower tail 27 where the doping concentration decreases from each concentration peak 25 toward the lower surface 23 and an upper tail 28 where the doping concentration decreases from each concentration peak 25 toward the upper surface 21. In FIG. 5, although signs of the lower tail 27 and the upper tail 28 are provided to the second concentration peak 25-2, other concentration peaks 25 also have the lower tail 27 and the upper tail 28.

The concentration peak 25 of this example is formed by ion implantation of an N type dopant such as hydrogen from the lower surface 23. In this case, relatively many N type dopants exist in a region between the implantation position and the lower surface 23 relative to a region between the implantation position and the upper surface 21. Therefore, the doping concentration decreases more gradually at the lower tail 27 of the doping concentration distribution of this example than at the upper tail 28.

Figure 6:
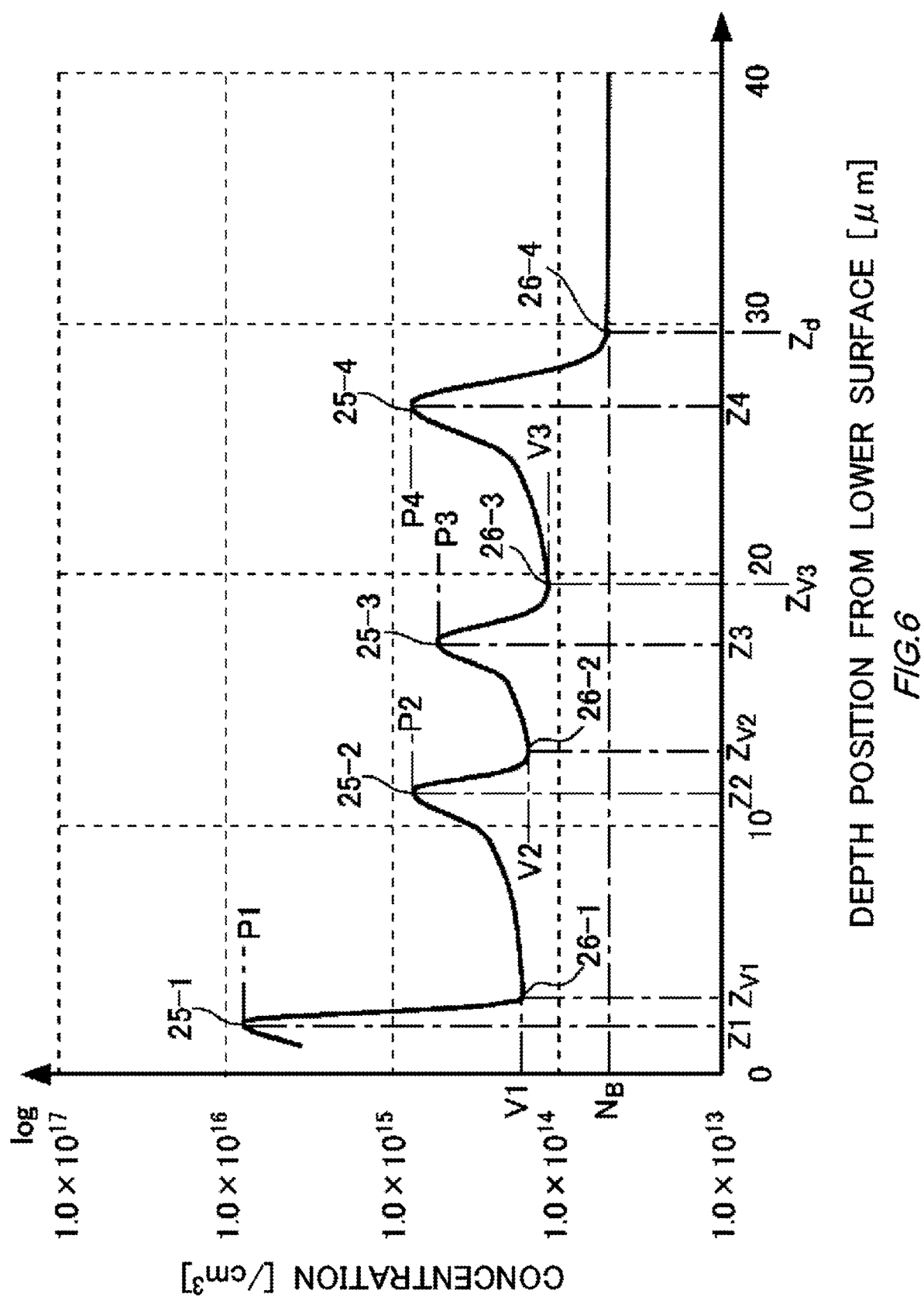
FIG. 6 illustrates another example of the doping concentration distribution in the buffer region 20.

FIG. 6 illustrates another example of the doping concentration distribution in the buffer region 20. In this example, a portion where the doping concentration is a local minimum value between each concentration peak 25 is referred to as a valley portion 26. The doping concentration distribution except for the valley portion 26 may be the same as or may be different from the example of FIG. 5. A first valley portion 26-1 having a concentration V1 located at a depth $Z_{V1}$ is arranged between the first concentration peak 25-1 and the second concentration peak 25-2, a second valley portion 26-2 having a concentration V2 located at a depth $Z_{V2}$ is arranged between the second concentration peak 25-2 and the third concentration peak 25-3, and a third valley portion 26-3 having a concentration V3 located at a depth $Z_{V3}$ is arranged between the third concentration peak 25-3 and the high concentration peak 25-4. It is noted that between the high concentration peak 25-4 and the drift region 18, a fourth valley portion 26-4 may be arranged at a position Zd which has a doping concentration being substantially equal to the bulk donor concentration $N_B$ initially in a direction from the depth $Z_{V3}$ toward the upper surface 21.

The doping concentrations V1, V2, and V3 of respective valley portion 26 may be $1.0 \times 10^{14}/cm^3$ or more. Even if the doping concentration P2 of the second concentration peak 25-2 is reduced, maintaining the doping concentration of the valley portion 26 relatively high can facilitate maintaining the total dose amount in the buffer region 20 and maintaining the expansion suppression function of the depletion layer. The magnitude relationship and ratio of doping concentrations of each concentration peak 25 of this example as well as the depth position relationship may be the same as the example of FIG. 5.

The effective dose amount N2 of the second concentration peak 25-2 is lower than the effective dose amount N1 of the first concentration peak 25-1. Specifically, the effective dose amount N2 is less than $2.0 \times 10^{11}/cm^2$. The effective dose amount N2 may be $1.5 \times 10^{11}/cm^2$ or less, and may be $1.0 \times 10^{11}/cm^2$ or less. The effective dose amount N2 may be 0.1 times or less the effective dose amount N1 of the first concentration peak 25-1. The effective dose amount N2 may be 0.07 times or less, and may be 0.05 times or less the effective dose amount N1 of the first concentration peak 25-1. The effective dose amount Nn of an n-th concentration peak 25-$n$ may be an integrated value obtained by integrating a doping concentration for an interval from a position $Z_{Vn-1}$ of a valley portion 26-($n$−1), which is between an (n−1)-th peak being adjacent to the n-th concentration peak $25n$ on the lower surface 23 side and the n-th concentration peak $25n$, to a position $Z_{V_n}$ of a valley portion $26$-$n$, which is between an (n+1)-th peak being adjacent to the n-th concentration peak $25n$ on the upper surface 21 side and the n-th concentration peak $25n$. However, the effective dose amount NL of a concentration peak 25-L which is the closest to the upper surface 21 side may be an integrated value obtained by integrating a doping concentration for an interval from a position $Z_{V_{L-1}}$ of a valley portion 26-(L−1) to the position Zd. L is an L-th peak. L may be 1 or more, and L is 4 in this example.

Figure 7:
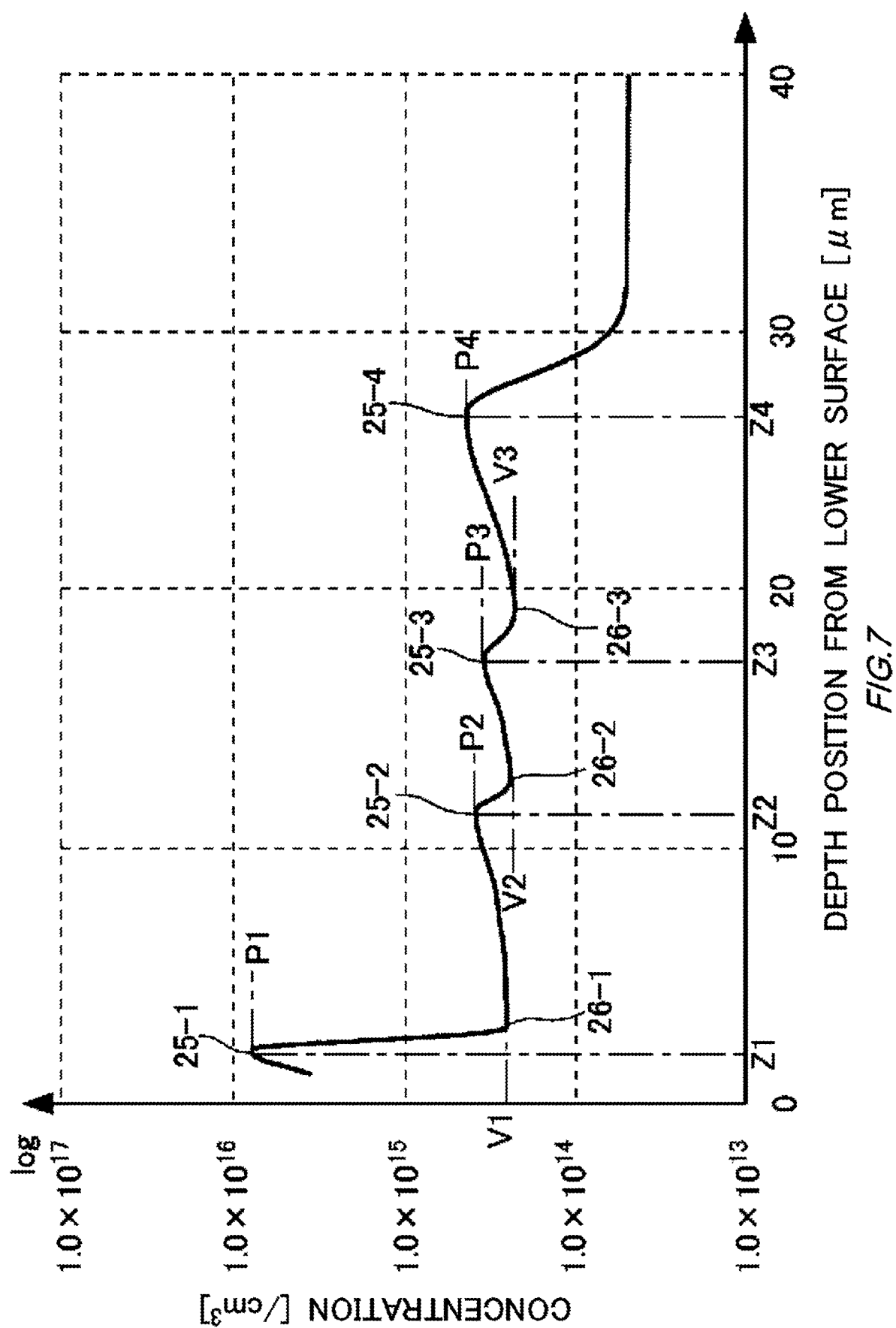
FIG. 7 illustrates another example of the doping concentration distribution in the buffer region 20.

FIG. 7 illustrates another example of the doping concentration distribution in the buffer region 20. In the buffer region 20 of this example, doping concentrations V1, V2, and V3 of respective valley portion 26 are higher than those of the example of FIG. 6. Each of the doping concentrations V1, V2, and V3 of the valley portions 26 of this example is $2.0\times10^{14}/cm^3$ or more and $5.0\times10^{14}/cm^3$ or less. This can facilitate suppressing the expansion of the depletion layer.

Doping concentrations of concentration peaks 25 other than the first concentration peak 25-1 of this example may be $3.0\times10^{14}/cm^3$ or more and $6.0\times10^{14}/cm^3$ or less. That is, the doping concentrations of concentration peaks 25 other than the first concentration peak 25-1 and all valley portions 26 are $2.0\times10^{14}/cm^3$ or more and $6.0\times10^{14}/cm^3$ or less. In this manner, while the doping concentrations of concentration peaks 25 other than the first concentration peak 25-1 are reduced to suppress the increase in dVce/dt, the dose amount of the buffer region 20 can be maintained to suppress the expansion of the depletion layer. A magnitude relationship and a ratio of doping concentrations of each concentration peak 25 of this example as well as a depth position relationship may be the same as the example of FIG. 5.

In this example, by providing the full width at half maximum of each concentration peak 25 relatively wide, a high doping concentration of the valley portion 26 is maintained. The shape of a concentration peak 25 depends on the shape of the distribution of N type dopants of ion implantation performed from the lower surface 23. For example, if an absorber is provided on the lower surface 23, and hydrogen ions are implanted with high acceleration energy, then a variation in the range of hydrogen ions becomes wider, and the full width at half maximum of the chemical concentration distribution of the implanted hydrogen becomes larger. In such a way, a doping concentration distribution as illustrated in FIG. 7 can be obtained.

Figure 8:
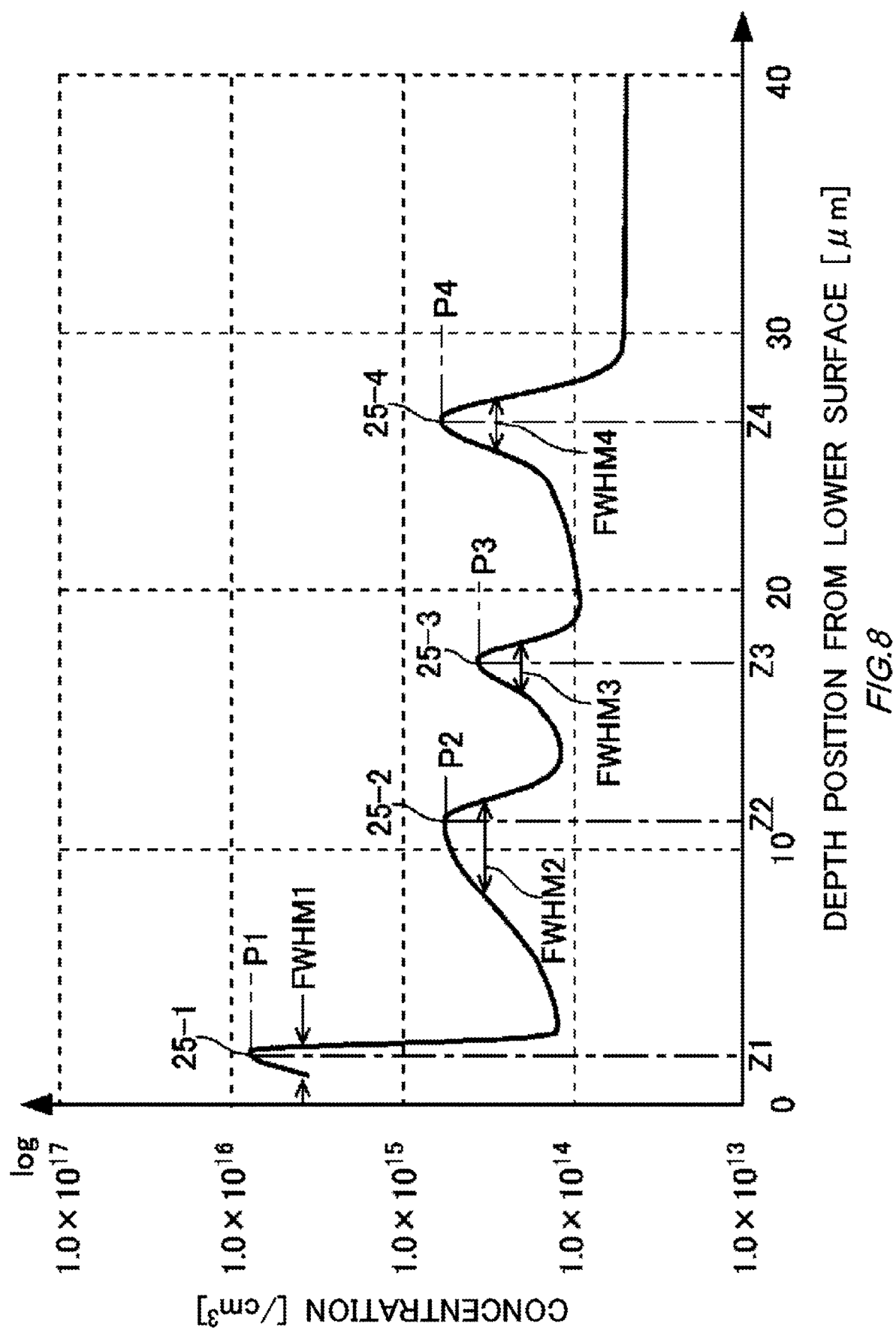
FIG. 8 illustrates another example of the doping concentration distribution in the buffer region 20.

FIG. 8 illustrates another example of the doping concentration distribution in the buffer region 20. In this example, the full width at half maximum of the first concentration peak 25-1 is referred to as FWHM1, the full width at half maximum of the second concentration peak 25-2 is referred to as FWHM2, the full width at half maximum of the third concentration peak 25-3 is referred to as FWHM3, and the full width at half maximum of the high concentration peak 25-4 is referred to as FWHM4.

Normally, as the distance from the lower surface 23 to a concentration peak 25 increases, the range of ion implantation becomes wider, and therefore full width at half maximum FWHM becomes larger. In this example, the full width at half maximum FWHM 2 of the second concentration peak 25-2 is larger than the full width at half maximum FWHM 4 of the high concentration peak 25-4. In this manner, even if the doping concentration P2 of the second concentration peak 25-2 is reduced, an integrated value of a doping concentration in the vicinity of the second concentration peak 25-2 can be increased. Therefore, suppressing the expansion of the depletion layer can be facilitated. The full width at half maximum FWHM 2 may be two times or more, may be three times or more, and may be four times or more the full width at half maximum FWHM 4. As described above, by providing an absorber with the lower surface 23 and by implanting hydrogen ions with high acceleration energy in the step of forming the second concentration peak 25-2, the full width at half maximum FWHM 2 can be enlarged. In the step of forming other concentration peaks 25, an absorber may not be provided with the lower surface 23.

The full width at half maximum FWHM 2 of the second concentration peak 25-2 may be larger than the full width at half maximum FWHM of any other concentration peaks 25. The full width at half maximum FWHM 2 of the second concentration peak 25-2 may be twice or more, may be three times or more, and may be four times or more the maximum full width at half maximum FWHM among the full width at half maximums FWHM of other concentration peaks 25. The doping concentration distribution except for the full width at half maximum FWHM 2 of the second concentration peak 25-2 is similar to any of the examples described in FIG. 5 to FIG. 7.

Figure 9:
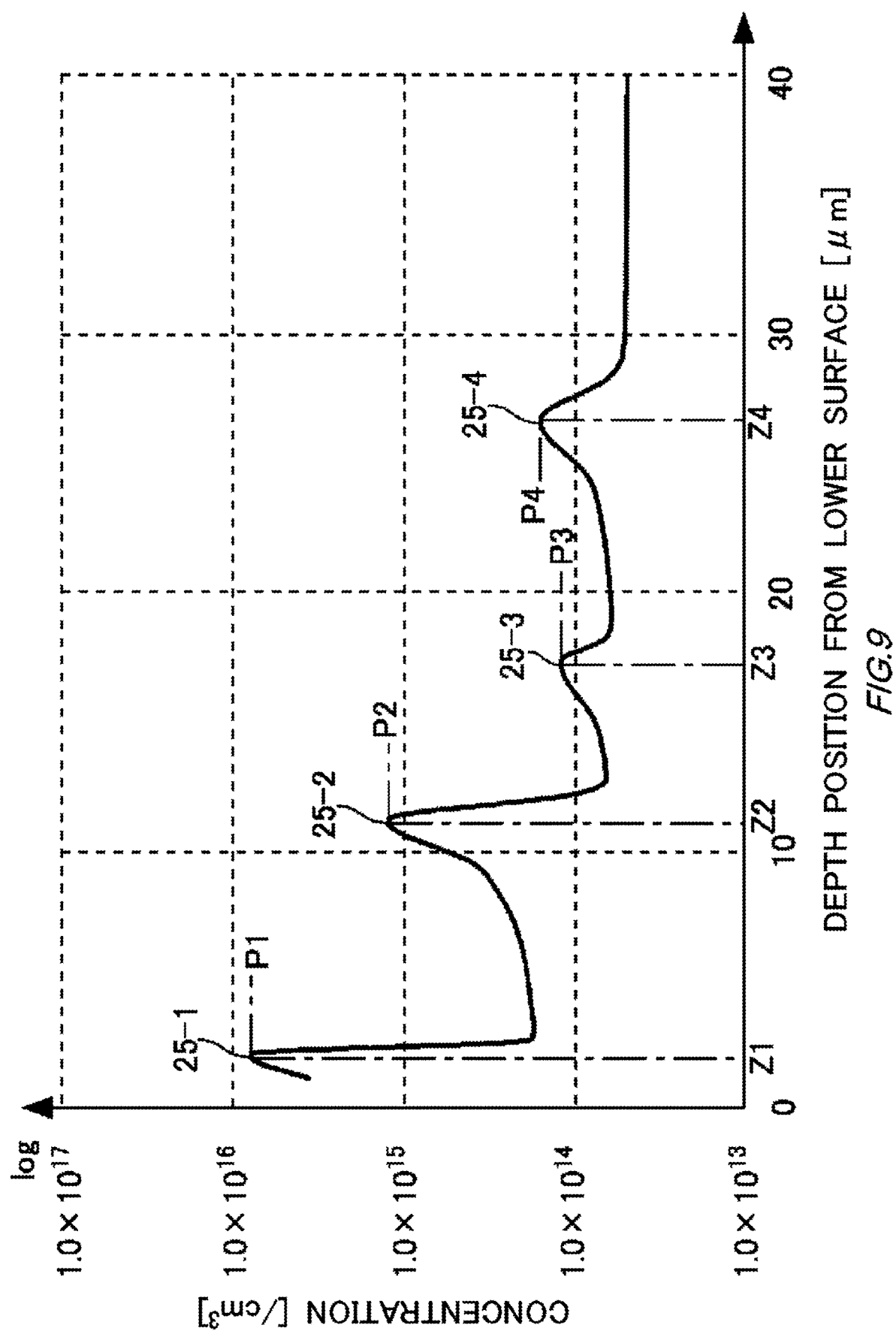
FIG. 9 illustrates a doping concentration distribution in a buffer region 20 according to a comparative example.

FIG. 9 illustrates a doping concentration distribution in a buffer region 20 according to a comparative example. In this example, the doping concentration P2 of the second concentration peak 25-2 is higher than $1.0\times10^{15}/cm^3$. Also, the doping concentration P4 of the high concentration peak 25-4 is substantially 10% to 20% of the doping concentration P2 of the second concentration peak 25-2.

Figure 10:
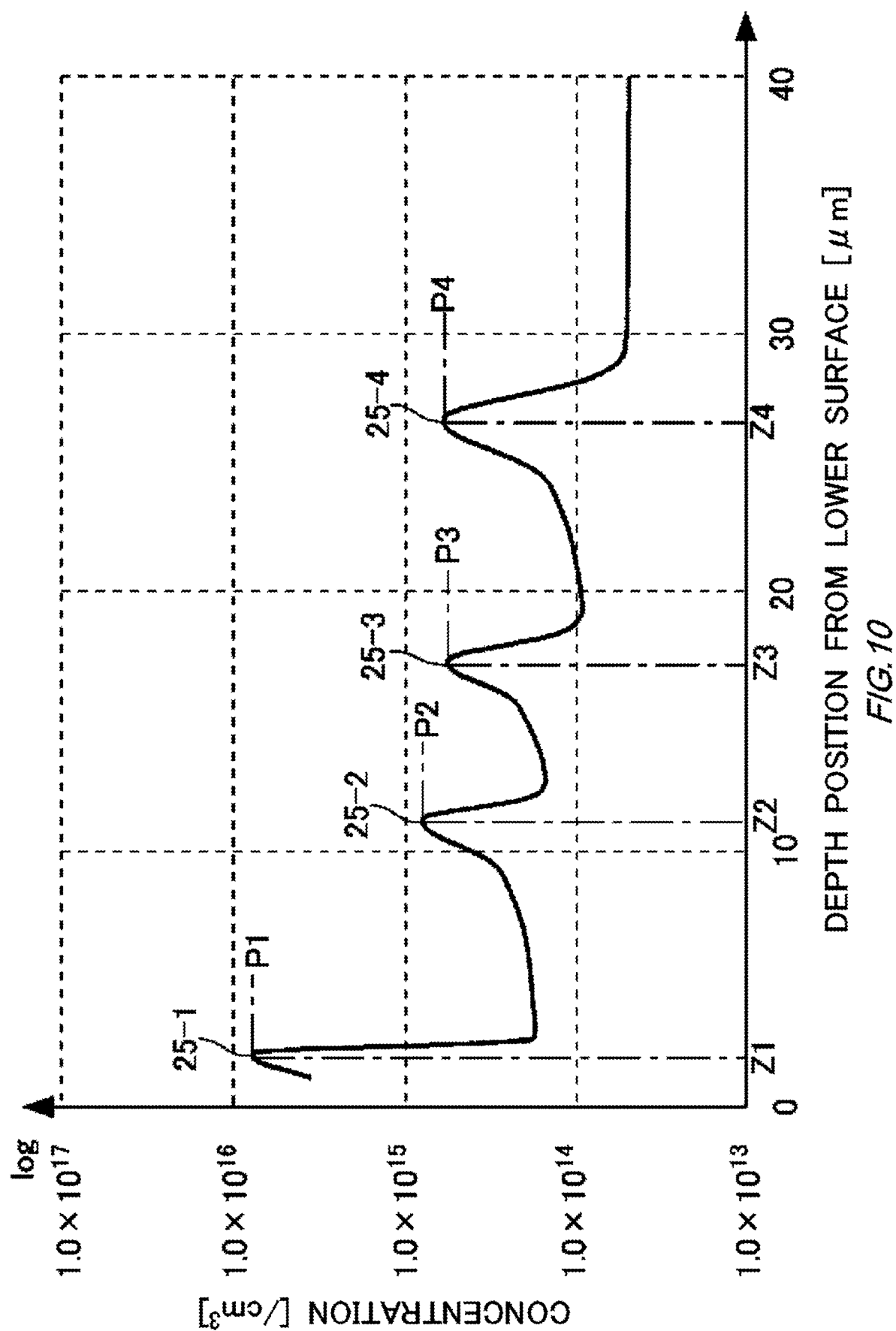
FIG. 10 illustrates a doping concentration distribution in a buffer region 20 according to a comparative example.

FIG. 10 illustrates a doping concentration distribution in a buffer region 20 according to a comparative example. In this example, while the doping concentration P2 of the second concentration peak 25-2 is smaller than $1.0\times10^{15}/cm^3$, the doping concentration P4 of the high concentration peak 25-4 is smaller than the doping concentration P2 of the second concentration peak 25-2.

Figure 11:
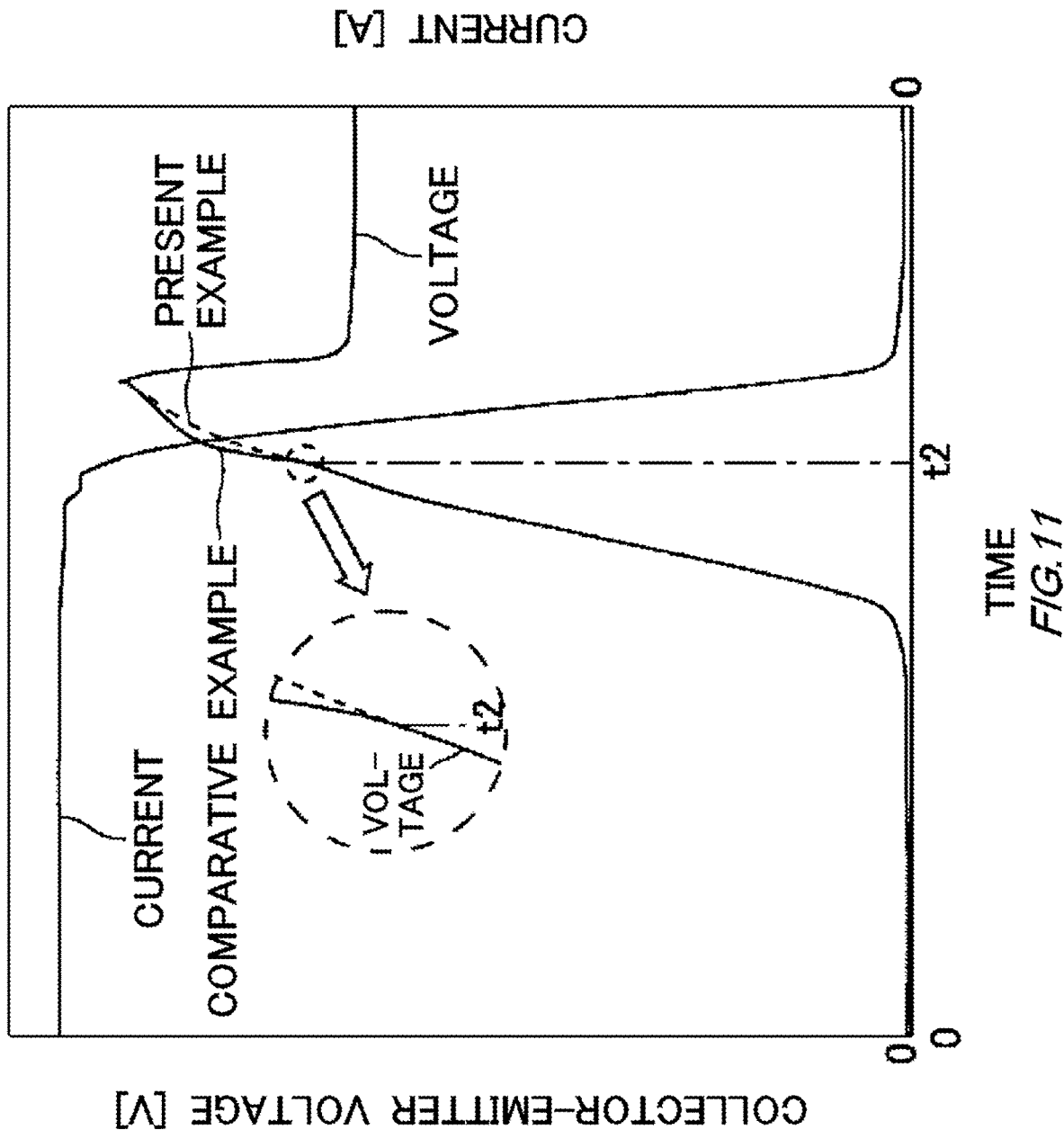
FIG. 11 illustrates an example of a time waveform of a collector-emitter voltage Vce and a collector current at a time of turn-off of a semiconductor device.

FIG. 11 illustrates an example of a time waveform of a collector-emitter voltage Vce and a collector current at the time of turn-off of a semiconductor device. The semiconductor device of this example has the doping concentration distribution according to a comparative example illustrated in FIG. 9.

When the semiconductor device is turned off, the collector current is decreased, and the collector-emitter voltage Vce rises. Further, the depletion layer gradually expands from a lower end of the base region 14 (see FIG. 3). At the timing when the depletion layer reaches each concentration peak 25, dVce/dt is temporarily increased. The increase in the slope dVce/dt is more significant when a value of Vce is large. The value of Vce increases as the depletion layer becomes closer to the lower surface 23. Therefore, if a concentration peak 25 having a high doping concentration is arranged close to the lower surface 23, dVce/dt results in being largely increased at the timing when the depletion layer reaches the concentration peak 25.

In the comparative example of FIG. 11, the doping concentration of the second concentration peak 25-2 is large. Therefore, at time t2, when the depletion layer reaches the second concentration peak 25-2, the slope dVce/dt of the collector-emitter voltage is largely increased. This increases the possibility of the semiconductor device according to the comparative examples to latch-up. In FIG. 11, an enlarged view of the time waveform of the collector-emitter voltage Vce in the vicinity of time t2 is illustrated in a rounded frame in a dashed line.

In contrast, in the semiconductor device 100 illustrated in FIG. 5 to FIG. 8, the doping concentration of the second concentration peak 25-2 is reduced. Therefore, the semiconductor device 100 can suppress the increase in dVce/dt when the depletion layer reaches the second concentration peak 25-2. Further, while the expansion suppression function of the depletion layer is maintained by providing the high concentration peak 25-4 having a relatively large doping concentration, the increase in dVce/dt when the depletion layer reaches the high concentration peak 25-4 can be suppressed because the high concentration peak 25-4 is provided at a position away from the lower surface 23. In this manner, the semiconductor device 100 can improve the latch-up withstand capability. It is noted that the voltage waveform in the example embodiment is illustrated by a dotted line waveform of the voltage waveform in FIG. 11 and a dotted line waveform in the rounded frame. The voltage waveform of the example embodiment for a period not illustrated in a dotted line is identical to the solid line of the comparative example.

Figure 12:
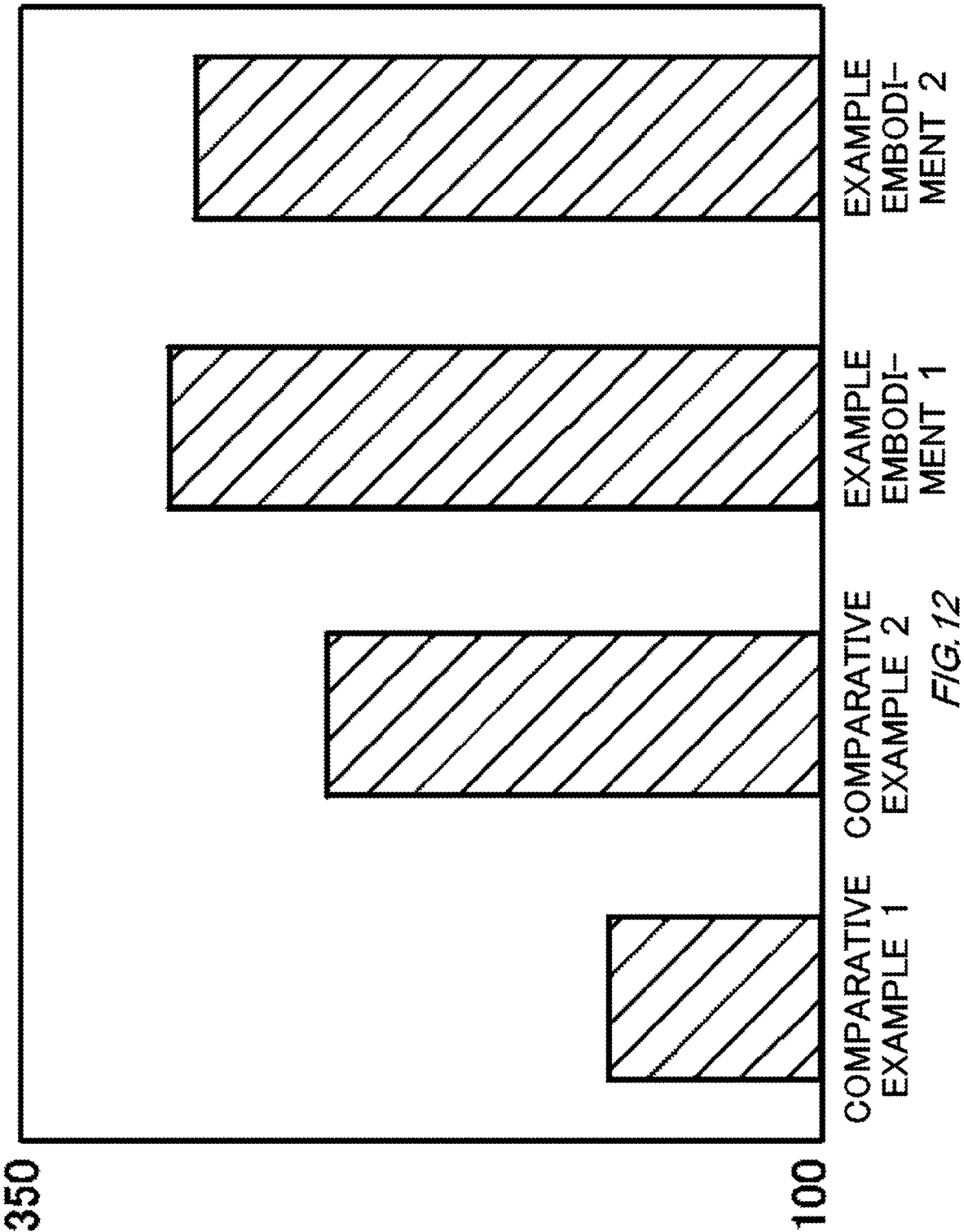
FIG. 12 illustrates an example of latch-up withstand capabilities of semiconductor devices according to comparative examples and example embodiments.

FIG. 12 illustrates an example of latch-up withstand capabilities of semiconductor devices according to comparative examples and example embodiments. The latch-up withstand capability of FIG. 12 is a latch-up withstand capability at room temperature. The semiconductor device according to comparative example 1 has the doping concentration distribution illustrated in FIG. 9, and the semiconductor device according to comparative example 2 has the doping concentration distribution illustrated in FIG. 10, the semiconductor device 100 according to example embodiment 1 has the doping concentration distribution illustrated in FIG. 5, and the semiconductor device 100 according to example embodiment 2 has the doping concentration distribution illustrated in FIG. 6.

Comparative example 1 has the high concentration peak 25-4 having a low doping concentration as illustrated in FIG. 9. Therefore, the depletion layer is likely to reach the second concentration peak 25-2 having a high doping concentration. Further, because the doping concentration of the second concentration peak 25-2 is high, dVce/dt is likely to increase, and the latch-up withstand capability is small.

In comparative example 2, as illustrated in FIG. 10, although the second concentration peak 25-2 has a low doping concentration, the doping concentration of the high concentration peak 25-4 is lower than that of the second concentration peak 25-2. Therefore, the depletion layer is likely to reach the second concentration peak 25-2, and the latch-up withstand capability is slightly small.

As illustrated in FIG. 5 and FIG. 6, in example embodiments 1 and 2, the doping concentration of the high concentration peak 25-4 is higher than the doping concentration of the second concentration peak 25-2. Therefore, the depletion layer can be prevented from reaching the second concentration peak 25-2. Further, even if the depletion layer has reached the second concentration peak 25-2, because the doping concentration of the second concentration peak 25-2 is low, the increase in dVce/dt can be suppressed. Therefore, the latch-up withstand capability can be increased. It is noted that latch-up withstand capabilities of the examples illustrated in FIG. 7 and FIG. 8 were also improved more than those of comparative examples 1 and 2.

A semiconductor device 100 used for a high-frequency operation may have the collector region 22 having a doping concentration set low in order to reduce a switching loss. For example, the doping concentration of the collector region 22 of the semiconductor device 100 is $7.0 \times 10^{16}/\text{cm}^3$ or less.

The doping concentration of the collector region 22 may be $1.0 \times 10^{16}/\text{cm}^3$ or more, and may be $6.0 \times 10^{16}/\text{cm}^3$ or more.

The latch-up withstand capability of a semiconductor device 100 is higher at room temperature than at high temperature in general. However, if the doping concentration of the collector region 22 is lowered, the latch-up withstand capability at room temperature may become lower than the latch-up withstand capability at high temperature. This phenomenon occurs because a carrier injection amount from the collector region 22 becomes smaller by lowering the doping concentration of the collector region 22, and dVce/dt at room temperature becomes larger than dVce/dt at high temperature.

If the doping concentration of the collector region 22 is increased, the latch-up withstand capability at room temperature can be improved. However, the carrier injection amount from the collector region 22 is increased, which results in increasing the switching loss. Therefore, for the high-frequency operation purpose, managing both suppressing the switching loss and improving the latch-up withstand capability at room temperature is especially difficult. The semiconductor device 100 of this example can improve the latch-up withstand capability at room temperature without increasing the doping concentration of the collector region 22.

Figure 13:
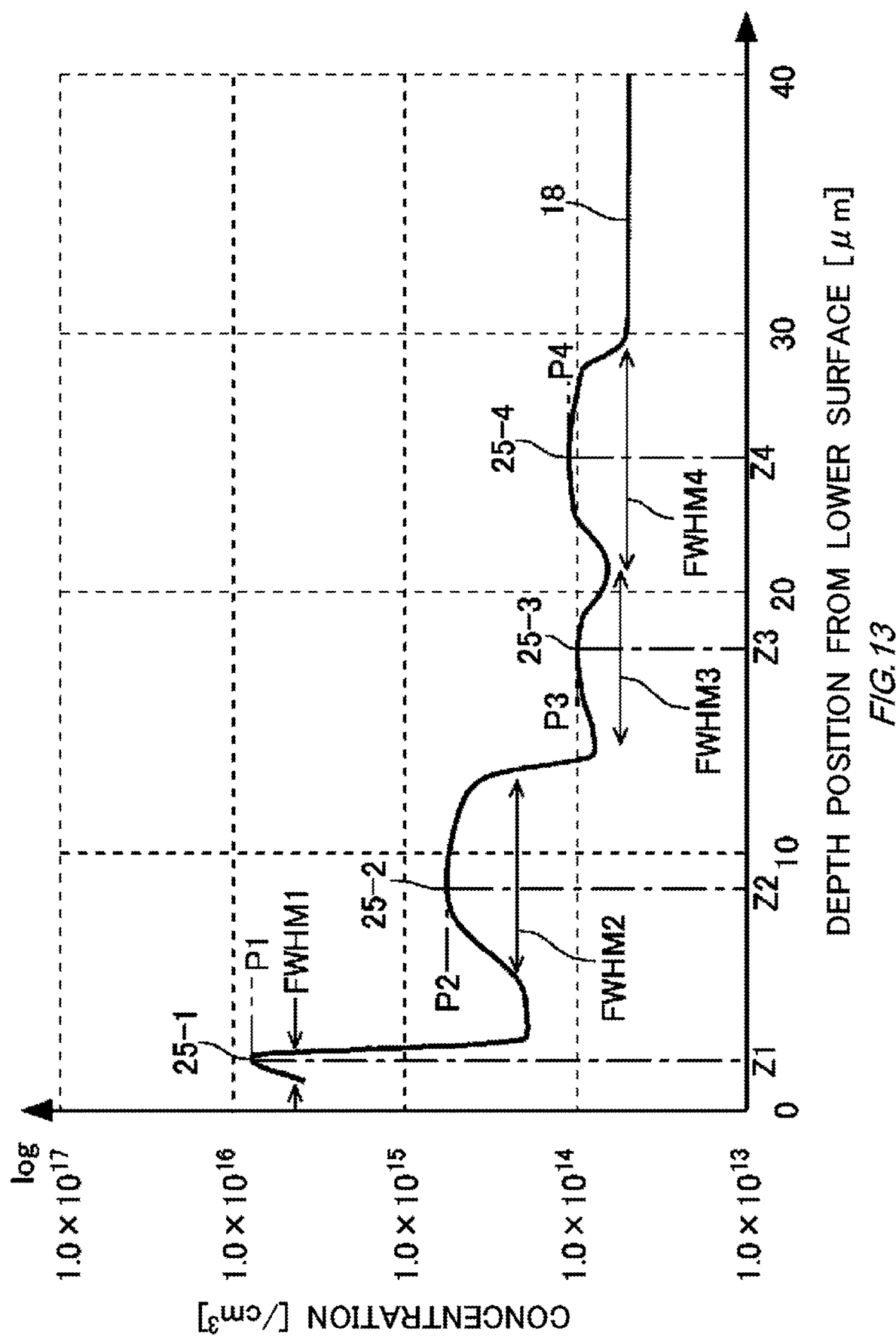
FIG. 13 illustrates another example of the doping concentration distribution in the buffer region 20.

FIG. 13 illustrates another example of the doping concentration distribution in the buffer region 20. In the buffer region 20 of this example, the size of the full width at half maximum FWHM of each concentration peak 25 is different from that of the examples described in FIG. 1 to FIG. 12. Other structures may be the same as or may different from those of any of buffer regions 20 described in FIG. 1 to FIG. 12.

In this example, the full width at half maximum FWHM 4 of a high concentration peak 25-4 is twice or more the full width at half maximum FWHM 1 of a first concentration peak 25-1. The full width at half maximum FWHM 4 may be four times or more, and may be 10 times or more the full width at half maximum FWHM 1. By enlarging the full width at half maximum FWHM 4 of the high concentration peak 25-4 which is close to the upper surface 21 of the semiconductor substrate 10, the integrated value of the doping concentration at the high concentration peak 25-4 can be increased. Therefore, the latch-up withstand capability at room temperature can be increased. Further, even if a peak concentration of the high concentration peak 25-4 is lowered, maintaining the integrated value of the doping concentration at the high concentration peak 25-4 is facilitated. Therefore, the peak concentration at the high concentration peak 25-4 is lowered to make it easier to suppress an oscillation of a voltage or current waveform in the case of a short circuit. It is noted that a short circuit refers to a state where a larger voltage is applied between an emitter electrode 52 and a collector electrode 24 compared to a time of normal operation.

Further, by reducing the full width at half maximum FWHM 1 of the first concentration peak 25-1, the formation of a donor with a high concentration in the collector region 22 can be prevented when the first concentration peak 25-1 is formed. Therefore, an impact of the doping concentration of the first concentration peak 25-1 on the doping concentration of the collector region 22 can be reduced, and a variation of Vce saturation voltage (Vce (sat)) in an ON-state of an IGBT can be suppressed. Further, by reducing the full width at half maximum FWHM 1 of the first concentration peak 25-1, even if the first concentration peak 25-1 is formed close to the lower surface 23, the impact on the doping concentration of the collector region 22 can be suppressed. Therefore, forming the first concentration peak 25-1 close to the lower surface 23 is facilitated, and the occurrence of back surface avalanche breakdown becomes easier to be suppressed.

It is noted that a portion having a local minimum value in a doping concentration distribution is referred to as a valley portion. If a doping concentration of a valley portion adjacent to a concentration peak 25 is half or more of a local maximum value of the doping concentration of the concentration peak 25, the valley portion may be used as an end portion of full width at half maximum FWHM. For example, if doping concentrations of two valley portions which sandwich a concentration peak 25 are both half or more of the local maximum value of the doping concentration the concentration peak 25, the interval of said two valley portions may be used as the full width at half maximum FWHM of the concentration peak 25. Also, if a doping concentration of the drift region 18 is half or more the doping concentration P4 of a high concentration peak 25-4, a boundary position between the drift region 18 and the high concentration peak 25-4 may be used as an upper end position of full width at half maximum FWHM 4. The boundary position between the drift region 18 and the high concentration peak 25-4 is a position where the doping concentration of the high concentration peak 25-4 is identical to the doping concentration of the drift region 18 initially in the direction from the depth position Z4 to the upper surface 21 of the semiconductor substrate 10.

Also, the full width at half maximum FWHM 2 of the second concentration peak 25-2 may be twice or more, may be four times or more, and may be 10 times or more the full width at half maximum FWHM 1 of the first concentration peak 25-1. By enlarging the full width at half maximum FWHM 2 of the second concentration peak 25-2, the latch-up withstand capability at room temperature can be further higher.

Also, the full width at half maximum FWHM 3 of the third concentration peak 25-3 may be twice or more, may be four times or more, and may be 10 times or more the full width at half maximum FWHM 1 of the first concentration peak 25-1. By enlarging the full width at half maximum FWHM 3 of the third concentration peak 25-3, the latch-up withstand capability at room temperature can be further higher. Also, an oscillation of a voltage or current waveform in the case of a short circuit can be further suppressed.

Among concentration peaks 25 of the buffer region 20, all concentration peaks 25 except for the first concentration peak 25-1 may have full width at half maximum twice or more, may have full width at half maximum four times or more, and may have full width at half maximum 10 times or more the full width at half maximum FWHM 1. Further, the full width at half maximum of a concentration peak 25 of the buffer region 20 may be larger as the distance from the lower surface 23 increases.

The full width at half maximum of each concentration peak 25 can be controlled, for example, by using different kinds of devices to implant hydrogen ions for respective depth position. For example, if an implantation device of a cyclotron type is used, full width at half maximum of s concentration peak 25 becomes relatively larger. Further, if the implantation device is used, when an accelerating voltage becomes larger, the full width at half maximum also becomes larger. Ion implantation may be performed on the first concentration peak 25-1 using an implantation device that is not the cyclotron type. Ion implantation may be performed on at least one of concentration peaks 25 other than the first concentration peak 25-1, using an implantation device of the cyclotron type.

The value of the doping concentration of the second concentration peak 25-1 when a slope toward the lower surface 23 is extended to the lower surface 23 is preferably less than or equal to the doping concentration of the drift region 18. Also, a range of the full width at half maximum FWHM 2 of the second concentration peak 25-2 and a range of the full width at half maximum FWHM 3 of the third concentration peak 25-3 are preferably away from one another in the depth direction. Also, a range of the full width at half maximum FWHM 3 of the third concentration peak 25-3 and a range of the full width at half maximum 25-4 of the high concentration peak 25-4 are preferably away from one another in the depth direction.

As an example, the full width at half maximum of the second concentration peak 25-2 and the third concentration peak 25-3 are 3 µm or more and 4 µm or less. The full width at half maximum of the high concentration peak 25-4 is 4 µm or more and 6 µm or less. Also, the acceleration energy of hydrogen ions when forming the second concentration peak 25-2 and the third concentration peak 25-3 may be 2.2 MeV or more and 2.7 MeV or less. The acceleration energy of hydrogen ions when forming the high concentration peak 25-4 may be 2.7 MeV or more and 3.6 MeV or less.

In the example of FIG. 13, the doping concentration P4 of the high concentration peak 25-4 is smaller than the doping concentration P2 of the second concentration peak 25-2. As an example, the doping concentration P4 may be 70% or less, may be 50% or less, and may be 30% or less of the doping concentration P2.

Also, the doping concentration P3 of the third concentration peak 25-3 may be smaller than the doping concentration P4. A relative relationship between the doping concentration P4 and the doping concentration P3 may be similar to examples described in FIG. 1 to FIG. 12. The doping concentration P3 is smaller than the doping concentration P2 of the second concentration peak 25-2. As an example, the doping concentration P3 may be 70% or less, may be 50% or less, and may be 30% or less of the doping concentration P2.

Also, the doping concentration P2 of the second concentration peak 25-2 may be 20% or less, and may be 10% or less of the doping concentration P1 of the first concentration peak 25-1. The doping concentration P2 may be 1% or more and may be 5% or more of the doping concentration P1. The dose amount of respective concentration peak 25 may be similar to examples described in FIG. 1 to FIG. 12. Also, the depth position Z2 of the second concentration peak 25-2 may be located closer to the lower surface 23 side and may be located closer to the upper surface 21 side relative to a center position of the second concentration peak 25-2. It is noted that a center of a peak refers to a center of a range of full width at half maximum FWHM of the peak. A depth position of a peak refers to a position of a local maximum (local maximum value) of the peak. In this example, the depth position Z2 of the second concentration peak 25-2 is located on the lower surface 23 side relative to the center position of the second concentration peak 25-2. Similarly to the depth position Z2 of the second concentration peak, a depth position Z3 of the third concentration peak 25-3 and the depth position Z4 of a fourth concentration peak 25-4 may be located on the lower surface 23 side, and may be located on the upper surface 21 side relative to the center position of the respective peak.

Figure 14:
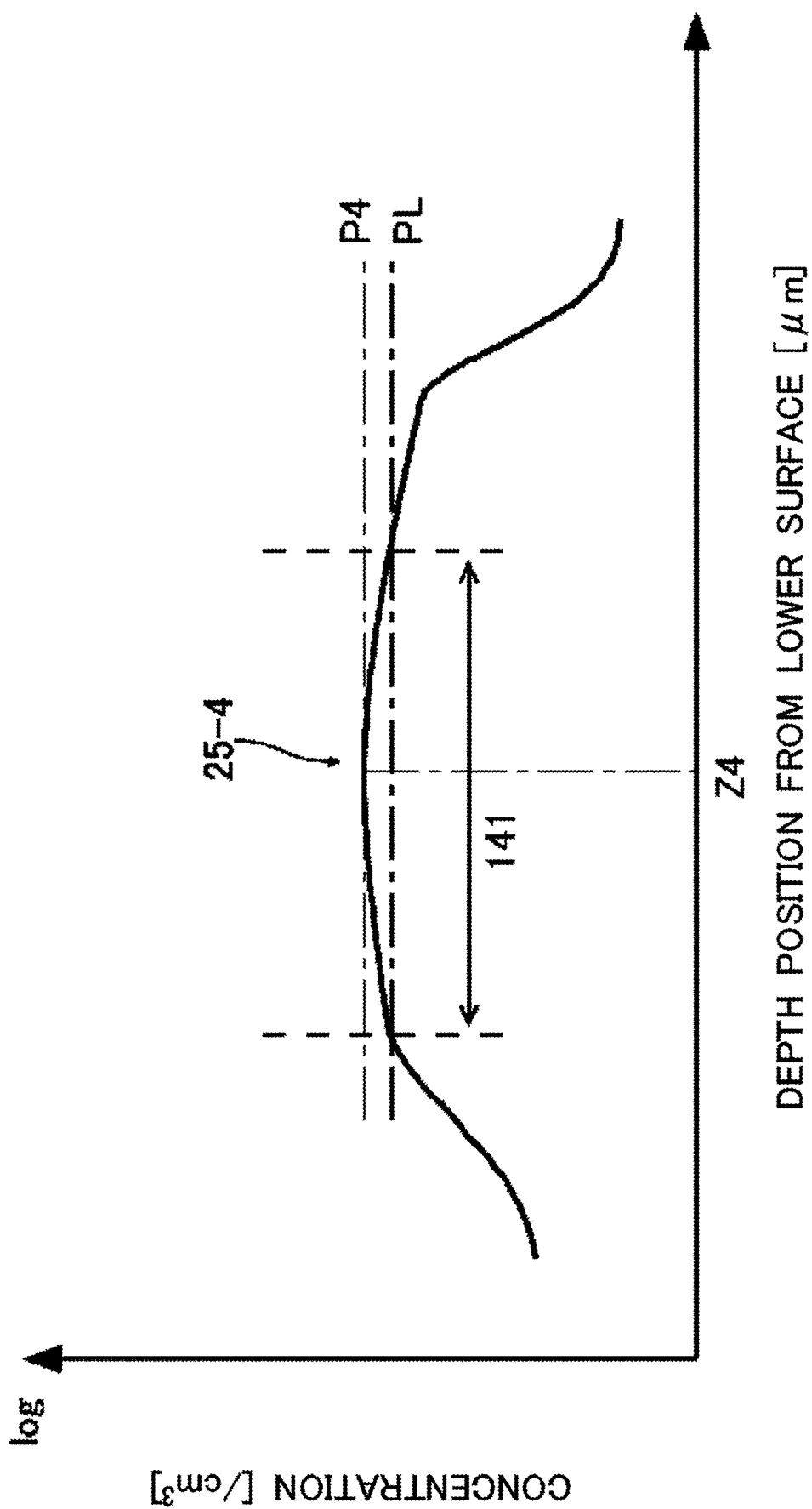
FIG. 14 is an enlarged view of a high concentration peak 25-4.

FIG. 14 is an enlarged view of a high concentration peak 25-4. The high concentration peak 25-4 of this example has a flat portion 141 having a flat doping concentration distribution in the depth direction. The flat portion 141 is provided for a predetermined depth range including a depth position (Z4 in this example) showing a local maximum value of the doping concentration. The length of the flat portion 141 in the depth direction may be 1 µm or more, may be 2 µm or more, may be 3 µm or more, and may be 5 µm or more. Also, a portion where the doping concentration distribution is flat refers to a portion where regions having a doping concentration less than or equal to a local maximum value (P4 in this example) and more than or equal to a lower limit concentration PL are continuous. The lower limit concentration PL may be 95%, may be 90%, may be 85%, may be 80%, and may be 70% of the local maximum value of the doping concentration (P4 in this example). In this manner, the full width at half maximum of the high concentration peak 25-4 can be enlarged.

In FIG. 14, an example of the high concentration peak 25-4 having the flat portion 141 is described. At least one of the second concentration peak 25-2 and the third concentration peak 25-3 may also have the flat portion 141. All of the concentration peaks 25 except for the first concentration peak 25-1 may have the flat portion 141.

Figure 15:
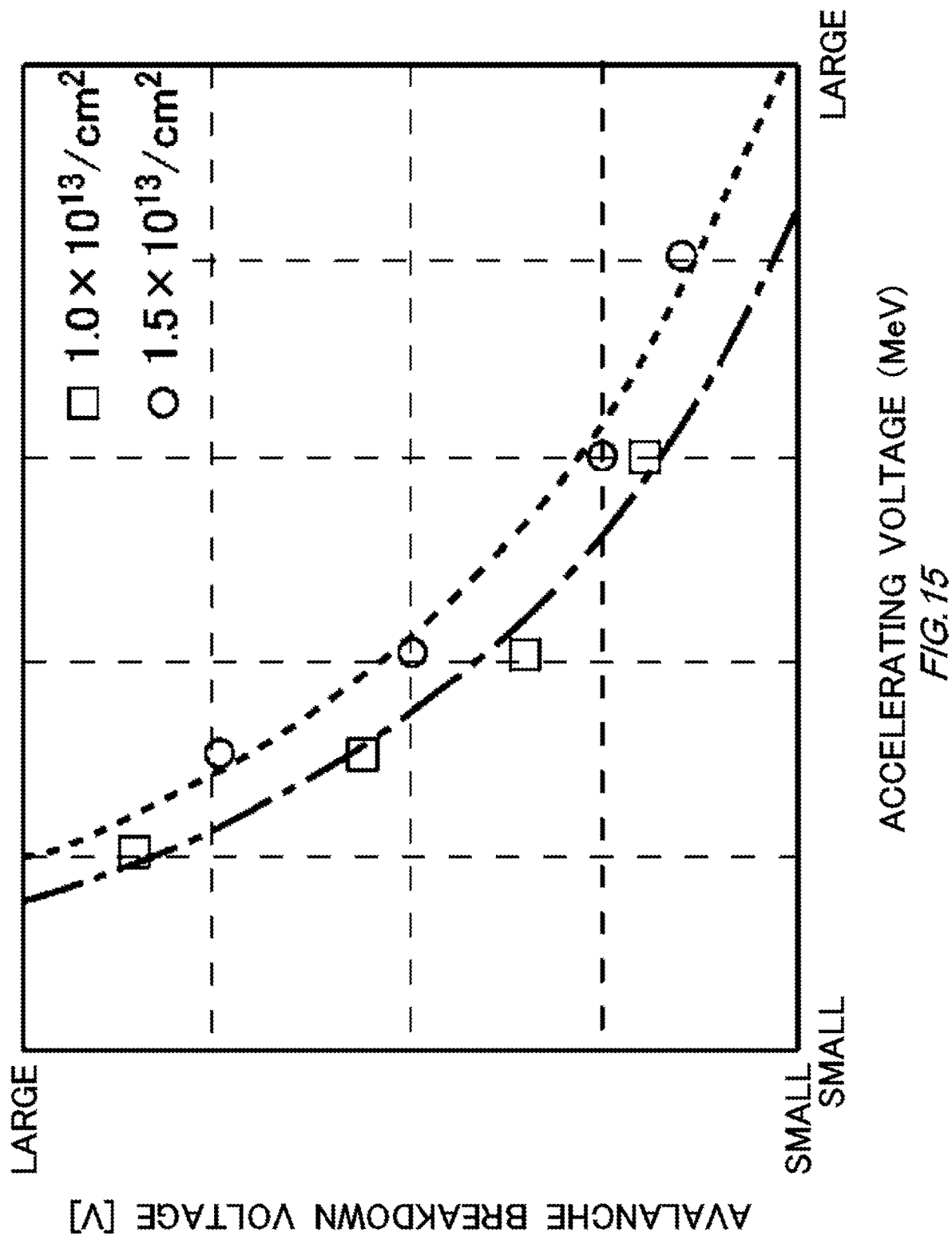
FIG. 15 illustrates the relationship between an accelerating voltage of hydrogen ions when forming a first concentration peak 25-1 and an avalanche breakdown voltage.

FIG. 15 illustrates the relationship between an accelerating voltage of hydrogen ions when forming a first concentration peak 25-1 and an avalanche breakdown voltage. As an accelerating voltage of hydrogen ions increases, the distance between the first concentration peak 25-1 and the lower surface 23 becomes larger. The avalanche breakdown voltage is an emitter-collector voltage with which an avalanche breakdown occurs in a region close to the buffer region 20 of the semiconductor substrate 10. Also, in FIG. 15, measured results of dose amounts of acceptor ions when forming the collector region 22 being $1.0 \times 10^{13}$ ions/cm$^2$ and $1.5 \times 10^{13}$ ions/cm$^2$ are illustrated.

As illustrated in FIG. 15, as the first concentration peak 25-1 is formed closer to the lower surface 23, the avalanche breakdown voltage can be increased. Therefore, reducing the full width at half maximum FWHM 1 of the first concentration peak 25-1 is preferable. In this manner, even if the first concentration peak 25-1 is arranged close to the lower surface 23, an impact on the collector region 22 can be reduced.

Figure 16:
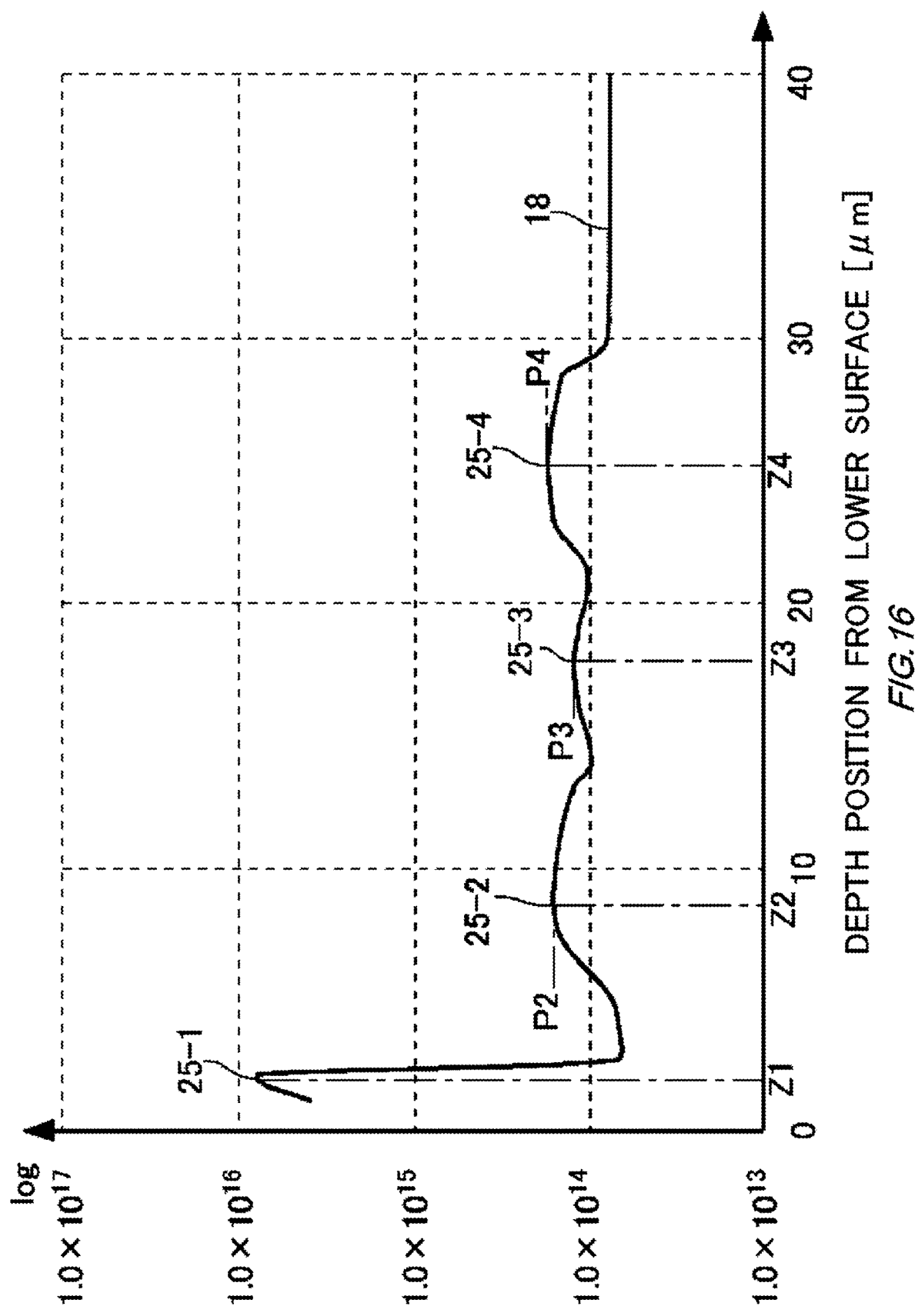
FIG. 16 illustrates another example of the doping concentration distribution in the buffer region 20.

FIG. 16 illustrates another example of the doping concentration distribution in the buffer region 20. In the buffer region 20 of this example, the full width at half maximum FWHM of respective concentration peak 25 is similar to any of examples described in FIG. 13 to FIG. 14. Also, doping concentrations P1 to P4 of respective concentration peak 25 are similar to any of the examples described in FIG. 1 to FIG. 12. According to this example, as described in FIG. 1 to FIG. 15, a latch-up withstand capability can be improved. According to this example, as described in FIG. 13 to FIG. 15, an avalanche breakdown voltage can be increased, and an oscillation of a voltage and current waveform in the case of a short circuit can be suppressed as well.

Figure 17:
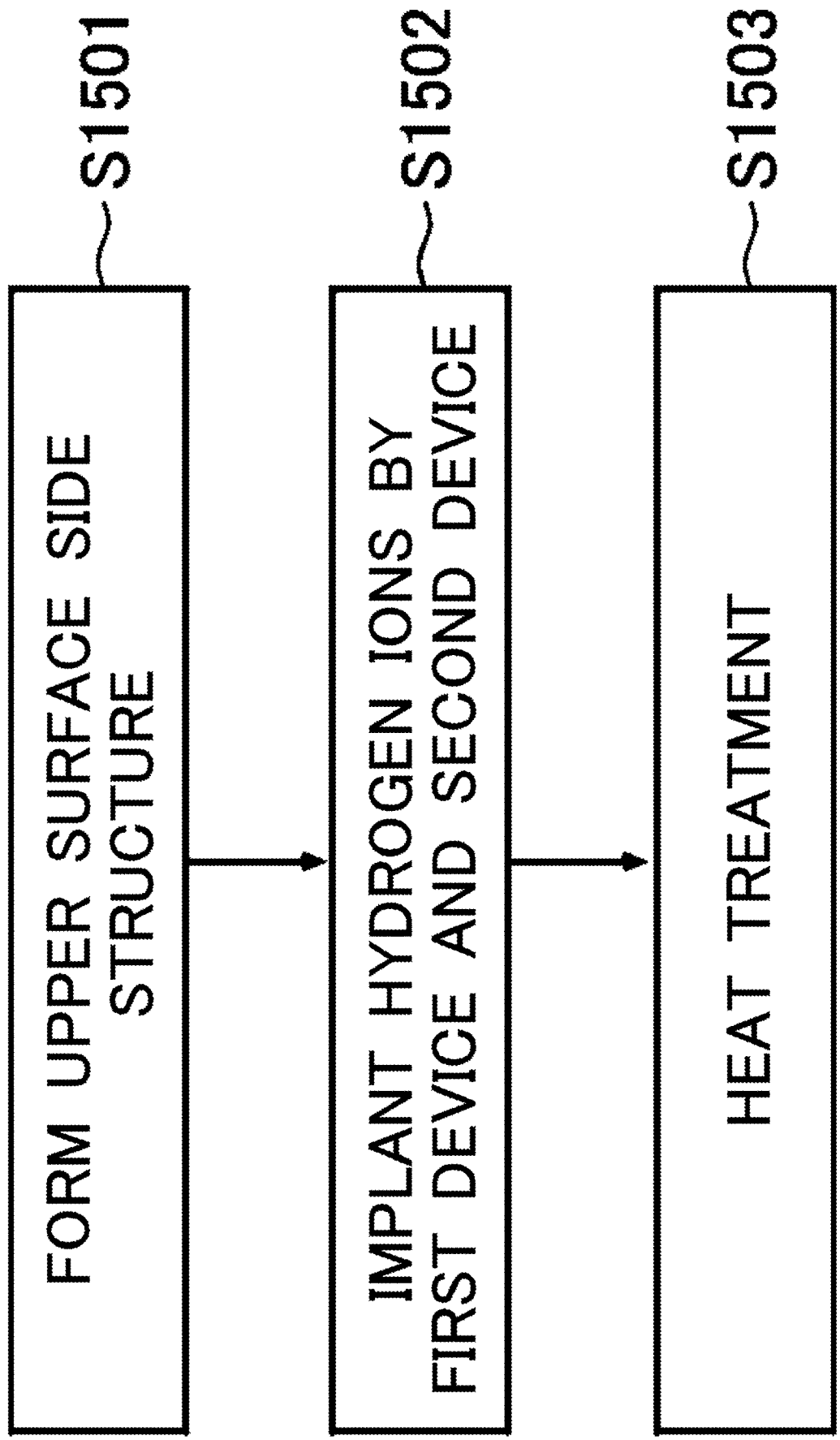
FIG. 17 illustrates some steps of the manufacturing process of the semiconductor device 100.

FIG. 17 illustrates some steps of the manufacturing process of the semiconductor device 100. The manufacturing method of this example has an upper surface side structure forming step S1501, an ion implantation step S1502, and a heat treatment step S1503.

In the upper surface side structure forming step S1501, a structure on the upper surface 21 side of the semiconductor substrate 10 is formed. The semiconductor substrate 10 may be a substrate of the N type. In this case, a remained region without other regions being formed is the drift region 18. The structure on the upper surface 21 side may refer to a structure on the upper surface 21 side relative to the center of the depth position of the semiconductor substrate 10. The structure on the upper surface 21 side includes, for example, the emitter region 12, the base region 14, the accumulation region 16, the trench portion and the like. The structure of the upper surface 21 side may include each dielectric film, such as an interlayer dielectric film 38 arranged above the upper surface 21 of the semiconductor substrate 10, and each conductive member, such as an emitter electrode 52.

In the ion implantation step S1502, hydrogen ions are implanted to three or more depth positions (for example, depth positions Z1, Z2, Z3, and Z4) from the lower surface 23 of the semiconductor substrate 10 in which the drift region 18 is provided. Herein, hydrogen ions are implanted to a first depth position which is closest to the lower surface 23 of the semiconductor substrate 10 (for example, Z1) among three or more depth positions, using the first device. The first device is, for example, a device that is not the cyclotron type. Further, hydrogen ions are implanted to the deepest depth position which is farthest from the lower surface 23 (Z4 for example) among three or more depth positions, using the second device different from the first device. If the same dose amount of hydrogen ions are implanted to the same depth position, full width at half maximum of a hydrogen chemical concentration distribution is larger using the second device than using the first device. The second device is, for example, a device of the cyclotron type. In S1502, the ion implantation may be performed to all depth positions (for example, Z2, Z3, and Z4) except for the first depth position (Z1) using the second device. Either of the hydrogen ion implantation using the first device and the hydrogen ion implantation using the second device may be performed earlier.

In the heat treatment step S1503, heat treatment is performed on the semiconductor substrate 10 to make the hydrogen ions implanted to the buffer region 20 hydrogen donors. In this manner, the buffer region 20 has the doping concentration distributions described in FIG. 13 to FIG. 16.

Before the heat treatment step S1503, the lower surface 23 of the semiconductor substrate 10 may be ground to adjust the thickness of the semiconductor substrate 10. Before or after the heat treatment step S1503, the collector region 22 and the cathode region 82 may be formed. After the heat treatment step S1503, the collector electrode 24 may be formed. Through such steps, the semiconductor device 100 can be manufactured.

Figure 18:
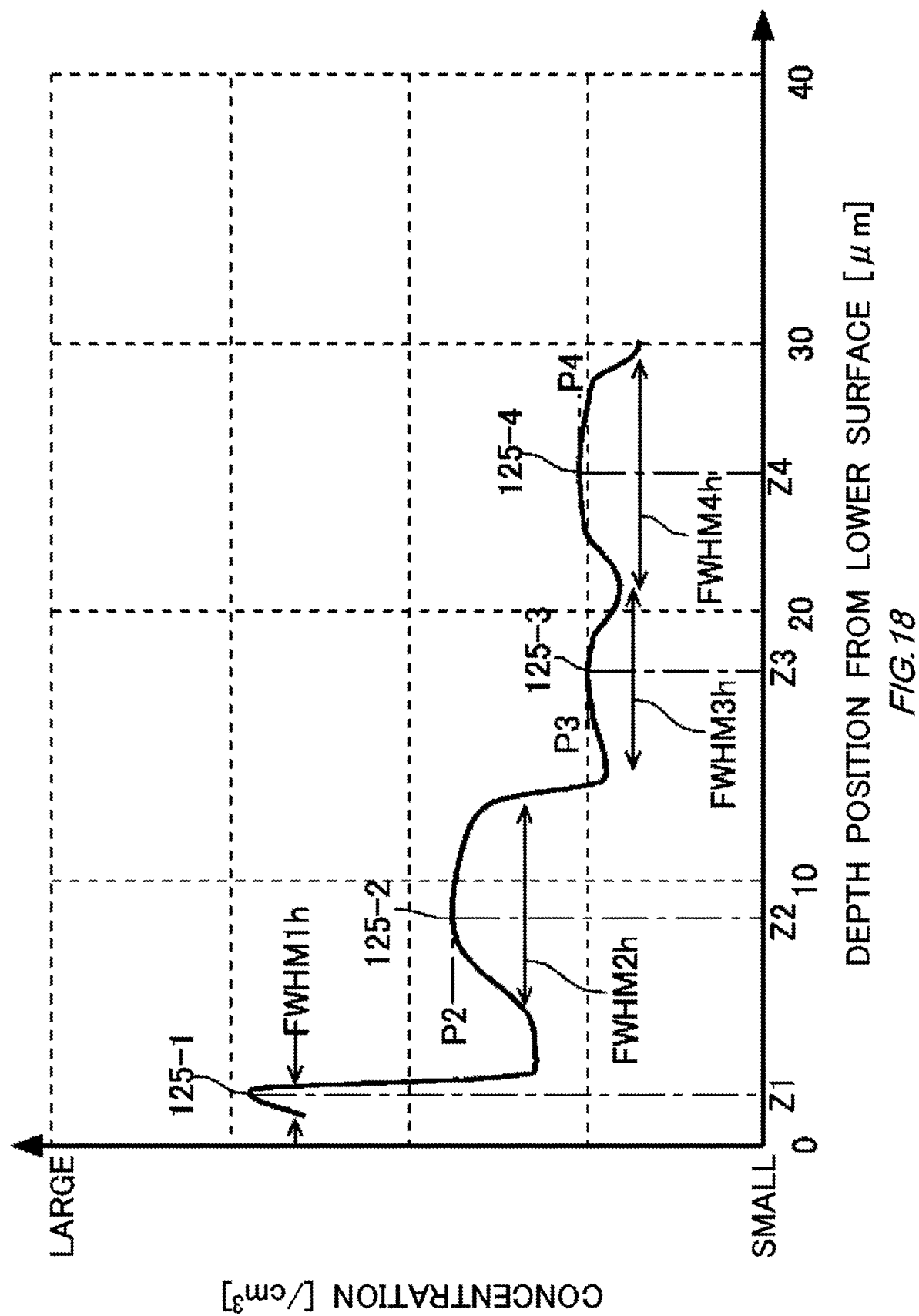
FIG. 18 illustrates an example of a hydrogen chemical concentration distribution in the buffer region 20 after a heat treatment step S1503.

FIG. 18 illustrates an example of a hydrogen chemical concentration distribution in the buffer region 20 after the heat treatment step S1503. The hydrogen chemical concentration distribution is similar to the doping concentration distributions of the buffer region 20 described in FIG. 13 to FIG. 16. The buffer region 20 of this example has a plurality of hydrogen concentration peaks 125. A hydrogen concentration peak 125-$k$ corresponds to a concentration peak 25-$k$. Corresponding hydrogen concentration peak 125-$k$ and concentration peak 25-$k$ may be arranged in the same depth position. Arranging two peaks at the same depth position may refer to arranging the local maximum of one peak is arranged within the full width at half maximum of the other peak.

The relative relationship of the concentration value and the full width at half maximum between hydrogen concentration peaks 125 is similar to the relative relationship of the concentration value and the full width at half maximum between corresponding concentration peaks 25. For example, full width at half maximum FWHM 4h of the hydrogen concentration peak 125-4 at the deepest depth position (Z4 in this example) may be twice or more, may be four times or more, and may be 10 times or more the full width at half maximum FWHM 1h of the hydrogen concentration peak 125-1 at the first depth position (Z1 in this example).

Figure 19:
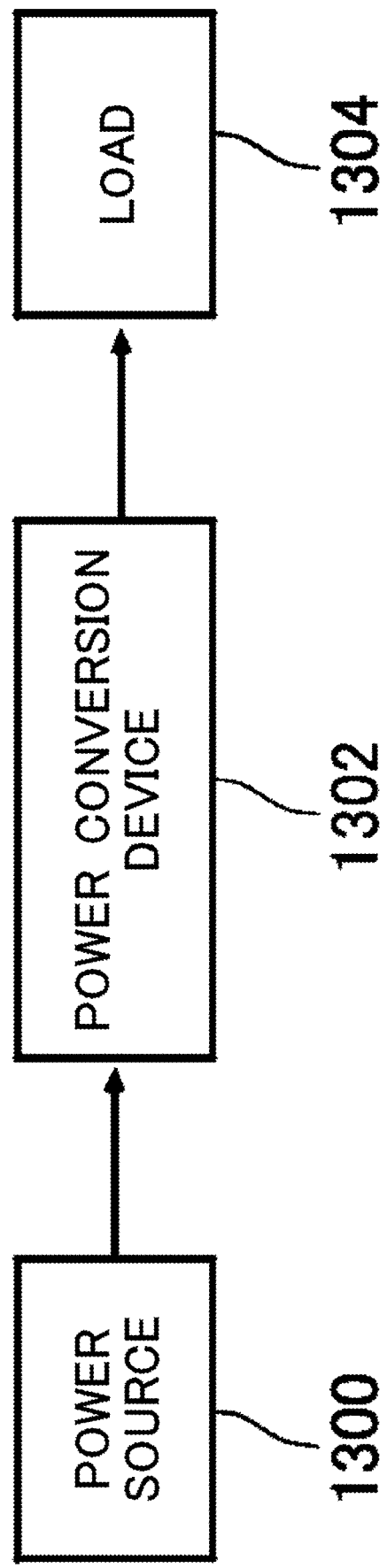
FIG. 19 is a diagram describing a power conversion device 1302 which uses the semiconductor device 100 described in FIG. 1 to FIG. 12.

FIG. 19 is a diagram describing a power conversion device 1302 which uses the semiconductor device 100 described in FIG. 1 to FIG. 18. The power conversion device 1302 converts characteristics, such as the voltage, current, frequency, and waveform, of the power supplied from the power source 1300 to supply the power to a load 1304. The semiconductor device 100 of this example may be used for the power conversion device 1302 for the high-frequency operation purpose. For example, the semiconductor device 100 may be used for a power conversion device 1302 for operations requiring a switching frequency (carrier frequency) of 10 kHz or more. Example purposes of the power conversion device 1302 include an inverter circuit of a welding machine. A switching frequency of the semiconductor device 100 in the power conversion device 1302 may be 20 kHz or more, and may be 30 kHz or more. Also, a switching frequency of the semiconductor device 100 in the power conversion device 1302 may be 200 kHz or less, and may be 100 kHz or less. It is noted that the purpose of the power conversion device performing a high-frequency operation is not limited to the inverter circuit of the welding machine. For example, the purpose may be an inverter circuit of an uninterruptible power supply device, an inverter circuit of a powertrain of an EV (Electric Vehicle) or an EHV (Electric Hybrid Vehicle), a circuit of a boost converter, an inverter circuit of an air conditioner, or the like.

While the embodiments of the present invention have been described, the technical scope of the invention is not limited to the above-described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: semiconductor substrate, 11: well region, 12: emitter region, 14: base region, 15: contact region, 16: accumulation region, 18: drift region, 20: buffer region, 21: upper surface, 22: collector region, 23: lower surface, 24: collector electrode, 25: concentration peak, 26: valley portion, 27: lower tail, 28: upper tail, 29: linear portion, 30: dummy trench portion, 31: edge portion, 32: dummy dielectric film, 34: dummy conductive portion, 38: interlayer dielectric film, 39: linear portion, 40: gate trench portion, 41: edge portion, 42: gate dielectric film, 44: gate conductive portion, 52: emitter electrode, 54: contact hole, 60, 61: mesa portion, 70: transistor portion, 80: diode portion, 81: extension region, 82: cathode region, 90: edge termination structure portion, 100: semiconductor device, 125: hydrogen concentration peak, 130: outer circumferential gate runner, 131: active-side gate runner, 141: flat portion, 160: active portion, 162: end side, 164: gate pad, 1300: power source, 1302: power conversion device, 1304: load

What is claimed is:

1. A semiconductor device comprising:
a semiconductor substrate having an upper surface and a lower surface and provided with a drift region of a first conductivity type;
a buffer region of the first conductivity type arranged between the drift region and the lower surface, wherein a doping concentration distribution in a depth direction of the semiconductor substrate has three or more concentration peaks; and
a collector region of a second conductivity type arranged between the buffer region and the lower surface,
wherein the three or more concentration peaks in the buffer region include:
a first concentration peak closest to the lower surface;
a second concentration peak closest, next to the first concentration peak, to the lower surface, arranged 5 µm or more distant from the lower surface in the depth direction, and having a doping concentration lower than the first concentration peak, the doping concentration being less than $1.0 \times 10^{15}/cm^3$; and
a high concentration peak arranged farther from the lower surface than the second concentration peak, and having a higher doping concentration than the second concentration peak,
wherein the doping concentration has a minimum value between each adjacent pair of the three or more concentration peaks, and
wherein the minimum value of the doping concentration between each adjacent pair of the three or more concentration peaks is $2.0 \times 10^{14}/cm^3$ or more and $5.0 \times 10^{14}/cm^3$ or less.

2. The semiconductor device according to claim 1, wherein a dose amount of a dopant of the second conductivity type in the collector region is $8 \times 10^{12}/cm^2$ or less.

3. The semiconductor device according to claim 1, the doping concentration of the first concentration peak is 0.1 times or more and 10 times or less a doping concentration of the collector region.

4. The semiconductor device according to claim 1, wherein full width at half maximum of the second concentration peak is larger than full width at half maximum of any of the concentration peaks other than the second concentration peak.

5. The semiconductor device according to claim 4, wherein full width at half maximum of the second concentration peak is larger than full width at half maximum of the high concentration peak.

6. The semiconductor device according to claim 4, wherein full width at half maximum of the second concentration peak is larger than full width at half maximum of any other concentration peaks.

7. The semiconductor device according to claim 1, wherein full width at half maximum of the high concentration peak is twice or more full width at half maximum of the first concentration peak.

8. The semiconductor device according to claim 1, wherein full width at half maximum of the second concentration peak is twice or more full width at half maximum of the first concentration peak.

9. The semiconductor device according to claim 1, wherein
the three or more concentration peaks in the buffer region include a third concentration peak arranged between the second concentration peak and the high concentration peak, and
full width at half maximum of the third concentration peak is twice or more full width at half maximum of the first concentration peak.

10. The semiconductor device according to claim 1, wherein the high concentration peak has a flat portion where the doping concentration distribution in the depth direction is flat, including a depth position at which the doping concentration indicates a local maximum value.

11. The semiconductor device according to claim 9, wherein the third concentration peak has a flat portion where the doping concentration distribution in the depth direction is flat, including a depth position at which the doping concentration indicates a local maximum value.

12. A semiconductor device comprising:
a semiconductor substrate having an upper surface and a lower surface and provided with a drift region of a first conductivity type;
a buffer region of the first conductivity type arranged between the drift region and the lower surface, wherein a doping concentration distribution of the buffer region in a depth direction of the semiconductor substrate has four concentration peaks; and
a collector region of a second conductivity type arranged between the buffer region and the lower surface, wherein
the four concentration peaks in the buffer region include:
a first concentration peak closest to the lower surface;
a second concentration peak arranged closest, next to the first concentration peak, to the lower surface;
a third concentration peak arranged between the second concentration peak and the upper surface; and
a fourth concentration peak arranged between the third concentration peak and the upper surface,
each of the first concentration peak, the second concentration peak, the third concentration peak, and the fourth concentration peak has a full width at half maximum,
full width at half maximum of the second concentration peak is larger than full width at half maximum of the third concentration peak and full width at half maximum of the fourth concentration peak.

13. The semiconductor device according to claim 12, wherein the upper surface side concentration peak is arranged closest to the upper surface among the three or more concentration peaks.

14. The semiconductor device according to claim 12, wherein the upper surface side concentration peak is arranged closest, next to the second concentration peak, to the lower surface.

15. The semiconductor device according to claim 12, wherein full width at half maximum of the second concentration peak is larger than full width at half maximum of any other concentration peaks.

16. A semiconductor device comprising:
a semiconductor substrate having an upper surface and a lower surface and provided with a drift region of a first conductivity type;
a buffer region of the first conductivity type arranged between the drift region and the lower surface, wherein a doping concentration distribution in a depth direction of the semiconductor substrate has three or more concentration peaks; and
a collector region of a second conductivity type arranged between the buffer region and the lower surface, wherein
the three or more concentration peaks in the buffer region include:
a first concentration peak arranged closest to the lower surface and having a doping concentration 0.1 times or more and 10 times or less the collector region; and
an upper surface side concentration peak arranged closer to the upper surface than the first concentration peak, and having the doping concentration being 0.1 times or less the first concentration peak.

17. The semiconductor device according to claim 16, wherein the doping concentration distribution in the depth direction of the buffer region has four or more concentration peaks,
wherein the four or more concentration peaks in the buffer region include:
the first concentration peak arranged closest to the lower surface; and
the upper surface side concentration peak arranged closer to the upper surface than the first concentration peak, and wherein the upper surface side concentration peak is arranged closest, next to the first concentration peak, to the lower surface.

18. A power conversion device comprising the semiconductor device according to claim 1,
wherein a carrier frequency is 10 kHz or more.

19. The semiconductor device according to claim 17, wherein the four or more concentration peaks include a third concentration peak having a doping concentration and a fourth concentration peak having a doping concentration, wherein the third concentration peak is arranged closest to the lower surface next to the upper surface side concentration peak, wherein the fourth peak is arranged closest to the lower surface next to the third concentration peak, and wherein the doping concentration of the fourth concentration peak is 0.1 times or less than the doping concentration of the first concentration peak.

* * * * *